(12) United States Patent
Hsu et al.

(10) Patent No.: US 7,447,292 B2
(45) Date of Patent: Nov. 4, 2008

(54) SHIFT REGISTER AND DRIVING CIRCUIT AND DISPLAY DEVICE USING THE SAME

(75) Inventors: Chun-Yuan Hsu, Taipei County (TW); Jan-Ruei Lin, Taipei County (TW); Hsiang-Yun Wei, Taipei (TW); Che-Cheng Kuo, Taoyuan County (TW); Chun-Yao Huang, Hsinchu (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 11/772,833

(22) Filed: Jul. 3, 2007

(65) Prior Publication Data

US 2008/0130822 A1   Jun. 5, 2008

(30) Foreign Application Priority Data

Dec. 5, 2006   (TW) .............................. 95145120 A

(51) Int. Cl.
   *G11C 19/00*   (2006.01)
(52) U.S. Cl. ........................................... 377/64; 377/67
(58) Field of Classification Search ....................... None
   See application file for complete search history.

(56) References Cited

U.S. PATENT DOCUMENTS 3,683,206 A  *  8/1972  Haraszti et al. ............. 327/208
3,931,538 A  *  1/1976  Itoh et al. .................... 327/57
6,693,617 B2     2/2004  Sasaki et al.
6,829,322 B2 * 12/2004  Shih et al. ..................... 377/78
6,928,135 B2 *  8/2005  Sasaki et al. ................. 377/64

FOREIGN PATENT DOCUMENTS

JP        2004-029540        1/2004

* cited by examiner

Primary Examiner—Cassandra Cox
(74) Attorney, Agent, or Firm—Jianq Chyun IP Office

(57) ABSTRACT

A shift register, a driving circuit and a display device using the same are disclosed. The shift register includes a $1^{st}$ and a $2^{nd}$ rectifying elements and $1^{st}$~$4^{th}$ transistors. $1^{st}$ source/drains of the $1^{st}$~$3^{rd}$ transistors receive a common voltage respectively. The gates of the $1^{st}$ and $3^{rd}$ transistors and a $2^{nd}$ source/drain of the $2^{nd}$ transistor are coupled to a $2^{nd}$ terminal of the $2^{nd}$ rectifying element. The gates of the $2^{nd}$ and $4^{th}$ transistors and a $2^{nd}$ source/drain of the $1^{st}$ transistor are coupled to a $2^{nd}$ terminal of the $1^{st}$ rectifying element. A $1^{st}$ source/drain of the $4^{th}$ transistor is coupled to a $2^{nd}$ source/drain of the $3^{rd}$ transistor. The $1^{st}$ terminals of the $1^{st}$ and $2^{nd}$ rectifying elements respectively receive input signals and a $1^{st}$ clock signal. A $2^{nd}$ source/drain of the $4^{th}$ transistor receives a $2^{nd}$ clock signal.

39 Claims, 15 Drawing Sheets

SHIFT REGISTER AND DRIVING CIRCUIT AND DISPLAY DEVICE USING THE SAME

CROSS-REFERENCE TO RELATED APPLICATION

This application claims the priority benefit of Taiwan application serial no. 95145120, filed on Dec. 5, 2006. All disclosure of the Taiwan application is incorporated herein by reference.

BACKGROUND OF THE INVENTION

1. Field of the Invention

The present invention relates to a shift register; in particular, to a shift register for reducing the number of clock control signals thereof, and a driving circuit and a display device using the same.

2. Description of Related Art

Nowadays the thin-film transistor (TFT) made from amorphous silicon (a-Si:H) is used in most liquid crystal displays (LCD). In the design of the large LCD panel, a driving integrated circuit is designed to surround the LCD panel. The gate voltage of the TFT is used for controlling the TFT to be on or off, wherein the corresponding pixel is driven by the source of a driving signal at proper timing through the on/off state of the TFT. As a result, each of the display pixels can function independently without being influenced by other display pixels.

The driving circuits in an LCD, like a scan driving circuit and a data driving circuit, are mainly coordinated with a clock control signal to output in order the scan driving signal and the data driving signal to the next stage shift register within a fixed duty cycle so as to drive each of the scan lines and the data lines in the LCD panel.

FIG. 1A is a circuit diagram of a shift register employed by a conventional N-type metal-oxide-semiconductor field-effect transistor (MOSFET). FIG. 1B is a timing diagram of the circuit operation of FIG. 1A. Referring to FIGS. 1A and 1B, within the period of $T_1$, when an input signal $G_{n-1}$ is a logic-high voltage, transistors N1 and N7-N8 are turned on such that the voltage of a node "P2" is pulled down to a logic-low voltage, that is, transistors N5-N6 and N10 are turned off. Meanwhile, a clock signal CLK1 inputs a logic-high voltage from a node "$c_1$" such that a transistor N2 is turned on and the voltage of a node "P1" is pulled up to conduct a transistor N9. Next, within the period of $T_2$, a clock signal CLK2 inputs a logic-high voltage from a node "$c_2$" to change an output signal $G_n$ into a logic-high voltage and transmit the logic-high voltage to the next stage device.

Within the period of $T_3$, the input signal $G_{n-1}$ is a logic-low voltage and the transistors N1 and N7-N8 are turned off. Meanwhile, the clock signal CLK1 inputs a logic-low voltage from the node "$c_1$" so that the transistor N2 is turned off. The voltage of the node "P1" is sufficient to turn on the transistor N9. The output signal $G_n$ changes into a logic-low voltage because of the logic-low voltage inputted from the node "$c_2$" by the clock signal CLK2 and is transmitted to the next stage device. Within the period of $T_4$, a clock signal CLK3 inputs a logic-high voltage from a node "$c_3$" to turn on transistors N3-N4. The voltage of the node "P2" is pulled up to turn on the transistors N5-N6 and N10, and the voltages of the node "P1" and the output signal $G_n$ are pulled down to logic-low voltages such that the resetting operation of the shift register is completed.

The foregoing single shift register requires 3 sets of clock signals CLK1-CLK3 to complete operation within the periods of $T_1$-$T_4$. The circuit consisted of a plurality of shift registers requires at least 4 sets of clock signals CLK1-CLK4 for controlling. FIG. 2A is a circuit block diagram of a conventional scan driving circuit consisted of a plurality of shift registers of different stages. FIG. 2B is a timing diagram of the circuit operation of FIG. 2A. Referring to FIGS. 2A and 2B, a first stage shift register 201 receives a scan driving signal SP. The first shift register 201 utilizes clock signals CLK1, CLK2 and CLK3 to output a signal $G_1$ during the period of $T_2$ through the input nodes "$c_1$", "$c_2$" and "$c_3$" (the same as the circuit operation of a single shift register 100 of FIG. 1A).

A second stage shift register 202 receives the output signal $G_1$ from the last stage shift register 201 and utilizes clock signals CLK2, CLK4 and CLK1 to output a signal $G_2$ within the period of $T_3$ through the clock input nodes "$c_1$", "$c_2$" and "$c_3$". A third stage shift register 203 receives the output signal $G_2$ from the last stage shift register 202 and utilizes clock signals CLK4, CLK3 and CLK2 to output a signal $G_3$ within the period of $T_4$ through the clock input nodes "$c_1$", "$c_2$" and "$c_3$". A fourth stage shift register 204 receives the output signal $G_3$ from the last stage shift register 203 and utilizes clock signals CLK3, CLK1 and CLK4 to output a signal $G_4$ within the period of $T_5$ through the clock input nodes "$c_1$", "$c_2$" and "$c_3$".

In the prior art, a multiple-stage shift register requires 4 sets of clock control signals to output one type of signal and cannot generate other complementary output signals to drive other pixel circuits. For instance, the driving circuit of an LCD with an organic light emitting diode (OLED) has to be supplied with additional control signals in order to complete the operation of driving the OLED. Moreover, since a shift register operates by transmitting the output signal from the last stage shift register as its own input signal to the next stage shift register, if an output impedance of the shift register is too large, a mistake in the level of the output signal from the last stage shift register would occur because of the loading effect of the next stage shift register, and cause the circuit operation to function abnormally. Besides, the said situation also creates overlapping of the output signals from shift registers of different stages. If such shift registers that may cause output signal overlapping are used in the scan driving circuit, two scan lines may be opened during the same time period, and the frame display is therefore rendered abnormal.

Furthermore, for LCD panels of medium and small sizes, for instance, the display panels of the cellular phone and the personal digital assistant (PDA), the driving circuit is designed to be disposed on the glass substrate of the LCD panel. Hence, a thin-film transistor (TFT) made from low temperature polycrystalline silicon (LTPS) is required. However, the driving circuit disposed on the glass substrate of the LCD panel is probably to be limited by unsatisfactory characteristics of the transistor element, such as low mobility, shifting threshold voltage and large leakage current. Therefore, during designing the driving circuit on the LCD panel, the above problems have to be especially taken into consideration so as to select appropriate elements. Generally speaking, during the process of manufacturing low temperature polycrystalline silicon, the P-type metal-oxide-semiconductor field effect transistor (MOSFET) is one of the elements whose characteristics possess better reliability.

SUMMARY OF THE INVENTION

A shift register is provided by the present invention. Only two sets of clock signals are required to control the output signals of the shift register. The number of the clock signals is thus reduced so as to further reduce the complexity and the area of the wiring in the hardware.

A driving circuit including a plurality of shift registers is further provided by the present invention. Only three sets of clock signals are required to control the operation of the driving circuit. The number of the clock signals is thus reduced so as to further reduce the complexity and the area of the wiring in the hardware.

The present invention is also directed to provide a display device including at least one scan driving circuit and a data driving circuit. The driving circuits are consisted of a plurality of shift registers operating with driving signals and three sets of clock signals to control each of the scan lines and data lines in the display device to achieve the purpose of displaying.

A shift register is provided by the present invention, and which includes a first to a second rectifying elements and a first to a fourth transistors. A first terminal of the first rectifying element is coupled to a first input node. A first terminal of the second rectifying element is coupled to a second input node. A first source/drain of the first transistor is coupled to a common voltage, wherein a gate of the first transistor is coupled to a second terminal of the second rectifying element, and a second source/drain of the first transistor is coupled to a second terminal of the first rectifying element. A first source/drain of the second transistor is coupled to the common voltage, wherein a gate of the second transistor is coupled to the second terminal of the first rectifying element, and a second source/drain of the second transistor is coupled to the second terminal of the second rectifying element. A first source/drain of the third transistor is coupled to the common voltage, wherein a gate of the third transistor is coupled to the second terminal of the second rectifying element, and a second source/drain is coupled to a first output node. A first source/drain of the fourth transistor is coupled to the first output node, wherein a gate of the fourth transistor is coupled to the second terminal of the first rectifying element, and a second source/drain of the fourth transistor is coupled to a third input node.

A driving circuit is provided by the present invention, and which includes a plurality of shift registers. Each of the shift registers includes a first to a second rectifying elements and a first to a fourth transistors, wherein all of the elements within the each shift register are coupled in the same way as described in the aforementioned shift register. A first input node of an $(i+1)^{th}$ shift register is coupled to a first output node of an $i^{th}$ shift register, and the $(i+1)^{th}$ shift register utilizes a first to a third clock signals to control the output of the driving circuit, where i is a non-zero natural number.

A display device is provided by the present invention, and which at least includes a scan driving circuit and a data driving circuit. Those driving circuits include a plurality of shift registers, wherein each of the shift registers includes a first to a second rectifying elements and a first to a fourth transistors, wherein all of the elements within the each shift register are coupled in the same way as described in the aforementioned shift register. A first input node of an $(i+1)^{th}$ shift register is coupled to a first output node of an $i^{th}$ shift register, and the $(i+1)^{th}$ shift register utilizes a first to a third clock signals to control the output of the driving circuit, where i is a non-zero natural number.

In one embodiment of the present invention, in the said driving circuit or display device, when i=3k+1, a second input node of the $i^{th}$ shift register receives the first clock signal, and a third input node of the $i^{th}$ shift register receives the second clock signal. When i=3k+2, the second input node of the $i^{th}$ shift register receives the second clock signal, and the third input node of the $i^{th}$ shift register receives the third clock signal. When i=3k, the second input node receives the third clock signal, and the third input node receives the first clock signal; where k is a natural number.

The said shift register, driving circuit or display device further includes a fifth to a sixth transistors in one embodiment of the invention. A first source/drain of the fifth transistor is coupled to a common voltage, wherein a gate of the fifth transistor is coupled to the second terminal of the second rectifying element, and a second source/drain of the fifth transistor is coupled to a second output node. A first source/drain of the sixth transistor is coupled to the second output node, wherein a gate of the sixth transistor is coupled to the second terminal of the first rectifying element, and a second source/drain of the sixth transistor is coupled to a third input node.

The said shift register, driving circuit and display device further includes an inverter in one embodiment of the invention. An input terminal of the inverter is coupled to the second output node, and an output terminal of the inverter is coupled to a third output node.

The inverter includes a seventh transistor and a third rectifying element in one embodiment of the invention. A first source/drain of the seventh transistor is coupled to a common voltage, wherein a gate of the seventh transistor is coupled to the second output node, and a second source/drain of the seventh transistor is coupled to the third output node. A first terminal of the third rectifying element is coupled to the second input node, and a second terminal of the third rectifying element is coupled to the third output node.

The said shift register, driving circuit and display device further includes an inverter in one embodiment of the invention. The input terminal of the inverter is coupled to the first output node, and the output terminal of the inverter is coupled to the third output node.

The inverter includes the seventh transistor and the third rectifying element in one embodiment of the invention. A first source/drain of the seventh transistor is coupled to a common voltage, wherein a gate of the seventh transistor is coupled to the first output node, and a second source/drain of the seventh transistor is coupled to the third output node. A first terminal of the third rectifying element is coupled to the second input node, and a second terminal of the third rectifying element is coupled to the third output node.

The said shift register, driving circuit and display device further includes an eighth transistor and a fourth rectifying element in one embodiment of the invention. A first source/drain of the eighth transistor is coupled to a common voltage, wherein a gate of the eighth transistor is coupled to the first input node, and a second source/drain of the eighth transistor is coupled to a fourth output node. A first terminal of the fourth rectifying element is coupled to the second input node, and a second terminal of the fourth rectifying element is coupled to the fourth output node.

The circuit design of the shift register in the present invention reduces the number of the clock control signals and further reduces the complexity and the area of the layout. The shift register can be further applied in general driving circuits to drive devices of different stages or in the scan driving circuit and the data driving circuit of the display device. Furthermore, the shift register provides appropriate output signals according to different designs of the driving pixel circuit in a display device. As regards the manufacturing techniques, the elements in the shift register of the invention may be selected according to the designer's needs or the characteristics of the elements.

In order to make the aforementioned and other objects, features and advantages of the present invention with more

DESCRIPTION OF EMBODIMENTS

Figure 1A:
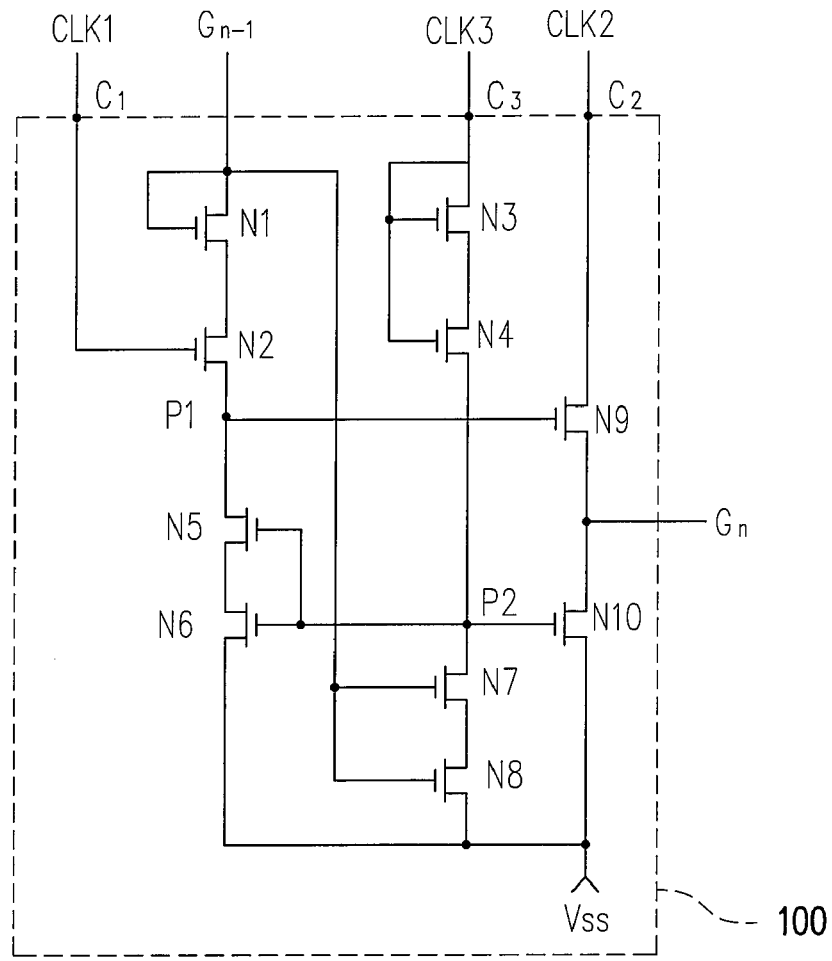
FIG. 1A is a circuit diagram of a shift register employed by a conventional N-type metal-oxide-semiconductor (MOS).
Figure 1B:
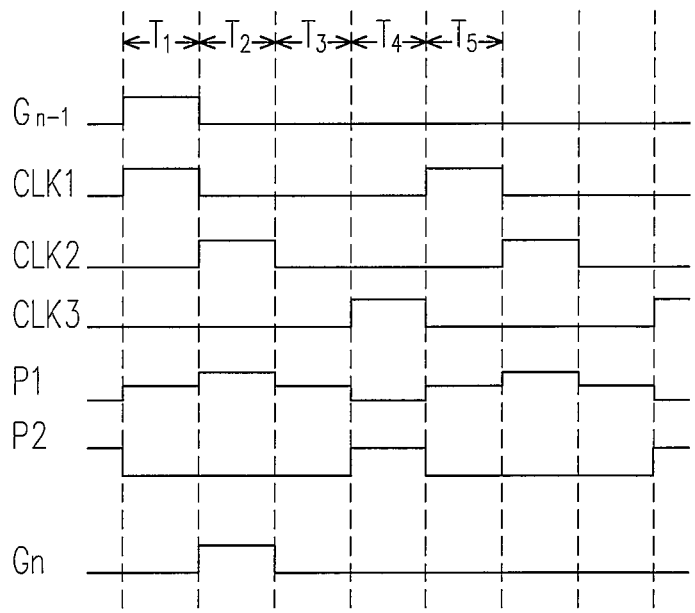
FIG. 1B is a timing diagram of the circuit operation of FIG. 1A.
Figure 2A:
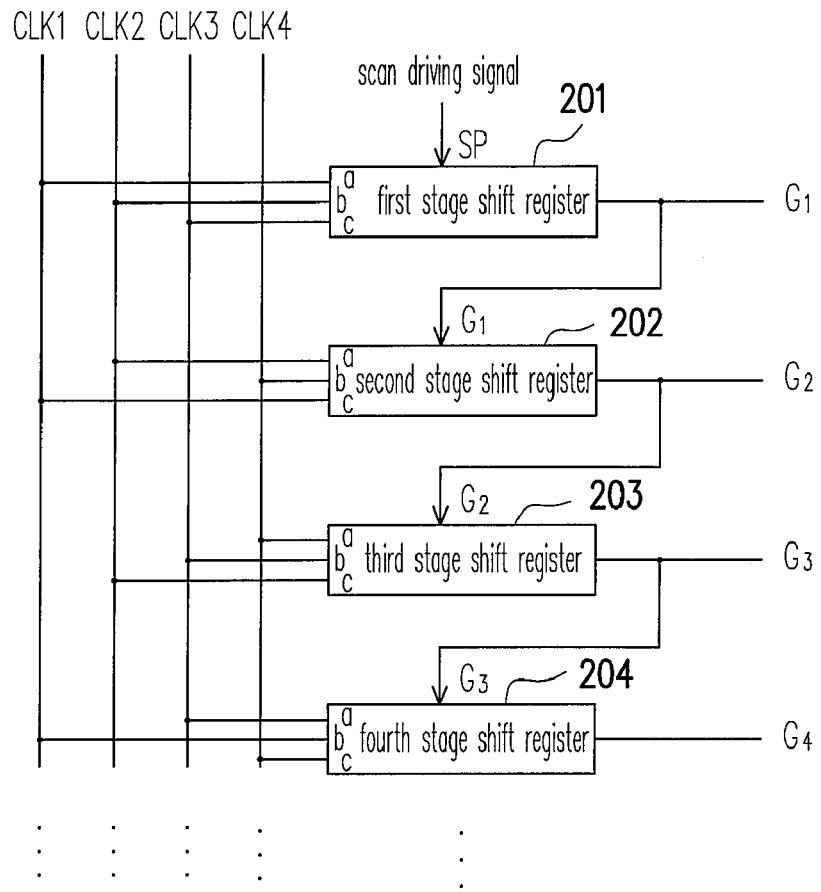
FIG. 2A is a circuit block diagram showing the connection of a conventional multi-staged shift register.
Figure 2B:
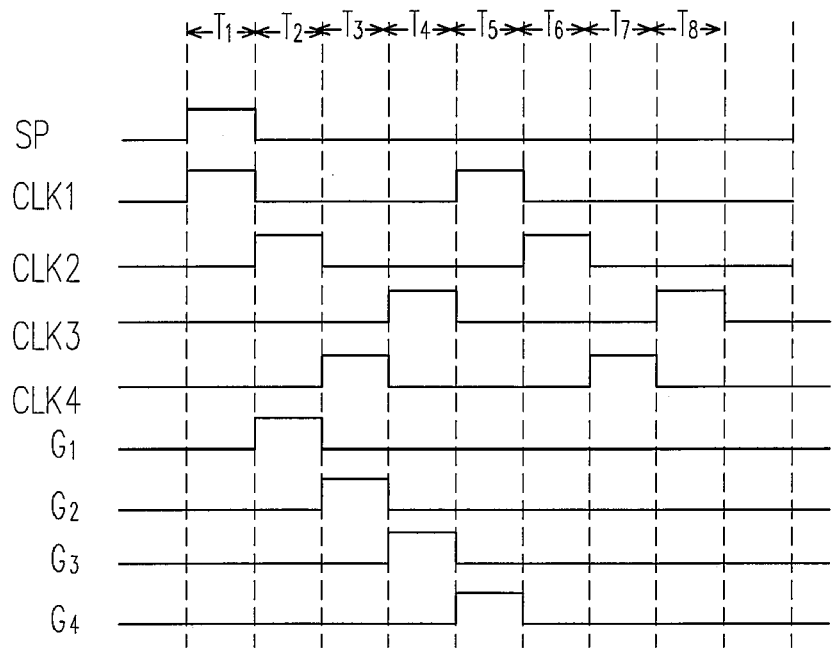
FIG. 2B is a timing diagram of the circuit operation of FIG. 2A.
Figure 3:
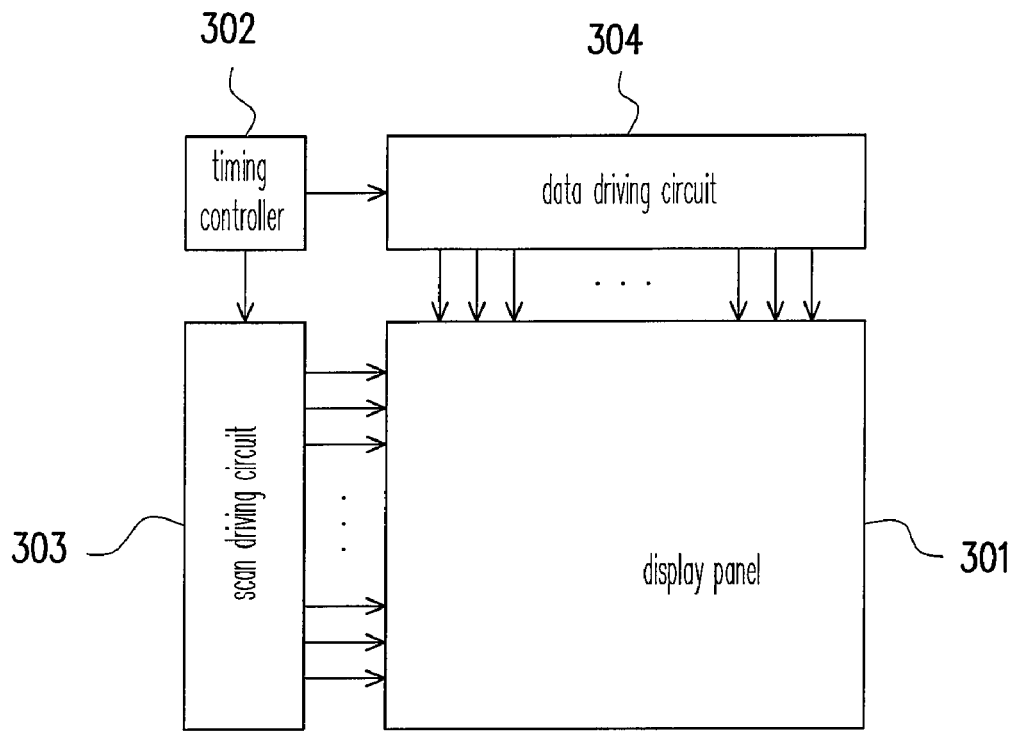
FIG. 3 is a circuit block diagram of a display device according to one embodiment of the invention.

FIG. 3 is a circuit block diagram of a display device according to one embodiment of the invention. Referring to FIG. 3, the display device includes a display panel 301, a timing controller 302, a scan driving circuit 303 and a data driving circuit 304. To facilitate explanation, it is assumed that the display device of the present embodiment is an LCD device, and the scan driving circuit 303 is utilized for describing the characteristic of the invention.

Figure 4:
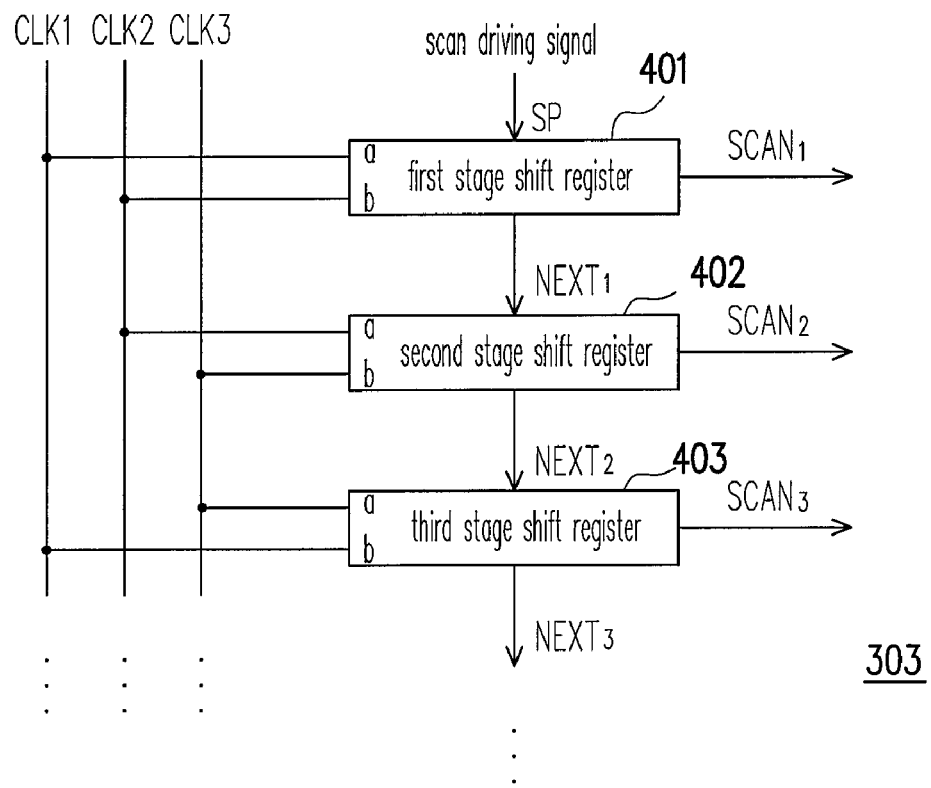
FIG. 4 is a circuit block diagram of the scan driving circuit according to the embodiment of FIG. 3.

FIG. 4 is a circuit block diagram of the scan driving circuit 303 according to the embodiment of FIG. 3. Referring to FIG. 4, the scan driving circuit 303 includes a plurality of shift registers 401-403 (only three shift registers of different stages are shown herein as the example). A first stage shift register 401 receives a scan driving signal SP and is controlled by clock signals CLK1-CLK3 to output the scan driving signal SP in order within a fixed duty cycle to different stage shift registers 402, 403 and so forth, so that each of the scan lines is opened in order. More details on the circuit and the circuit operation are to be followed hereunder.

Figure 5A:
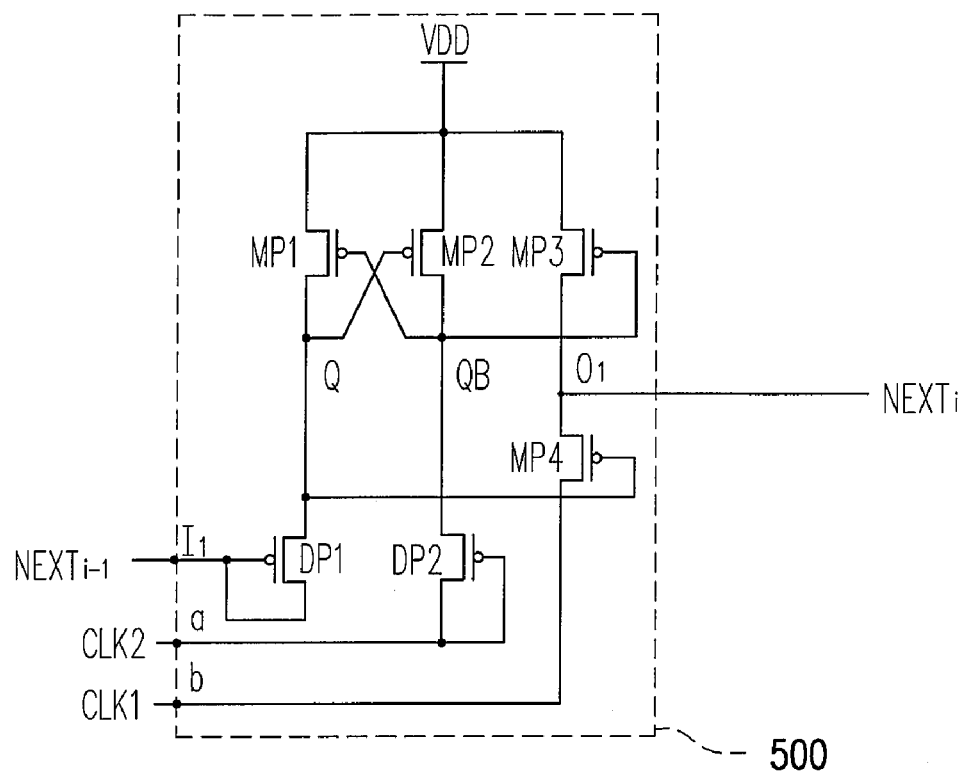
FIG. 5A is a circuit diagram of the shift register according to the embodiment of FIG. 4.

FIG. 5A is a circuit implementation diagram of the shift registers 401-403 according to the embodiment of FIG. 4. Referring to FIG. 5A, a shift register 500 is implemented by a P-type metal-oxide-semiconductor field effect transistor (MOSFET), wherein the shift register 500 includes transistors MP1-MP4 and transistors DP1-DP2. For the convenience of explanation, in this circuit diagram, a common voltage VDD and a plurality of nodes are marked out. They are "$I_1$", "a", "b", "$O_1$", "Q" and "QB". The common voltage VDD in the present embodiment may be a power source voltage.

Figure 5B:
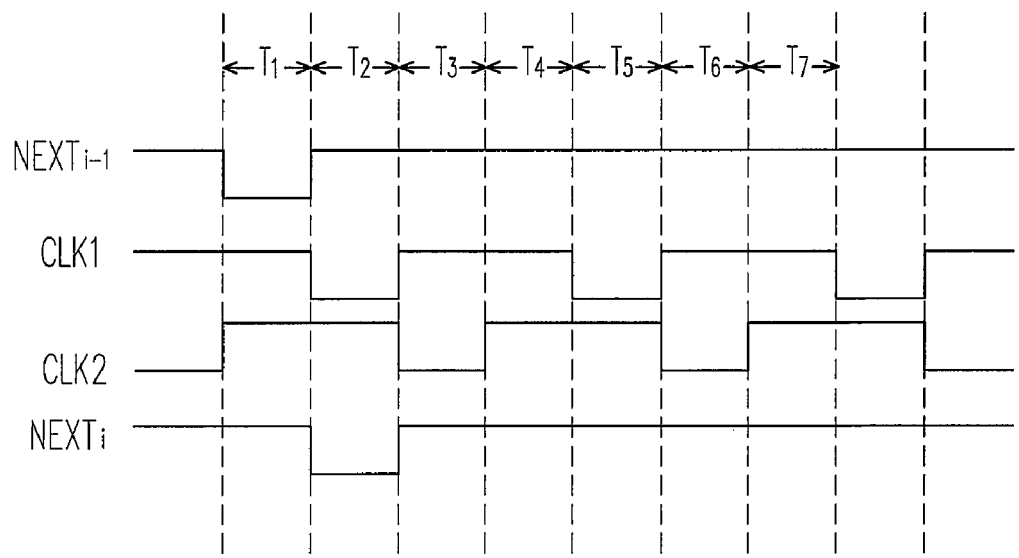
FIG. 5B is a timing diagram of the circuit operation of FIG. 5A.

FIG. 5B is a timing diagram of the circuit operation of FIG. 5A. Referring to FIGS. 5A and 5B, within the period of $T_1$, when a signal $NEXT_{i-1}$ is a logic-low voltage, since the transistor DP1 is diode-connected, the node "$I_1$" thereof where $NEXT_{i-1}$ is received is equivalent to the cathode of the diode. As a result, the voltage of the node "Q" is pulled down to a logic-low voltage through the transistor DP1 so as to turn on the transistors MP2 and MP4. Since the transistor MP2 is turned on, the voltage of the node "QB" is pulled up to a logic-high voltage such that the transistors MP1 and MP3 are turned off. Afterwards within the period of $T_2$, the clock signal CLK1 inputs a logic-low voltage from the node "b". Since the transistor MP4 is turned on, an output signal $NEXT_i$ is changed into a logic-low voltage, and the output signal $NEXT_i$ is outputted through the node "$O_1$" to the next stage shift register and the display panel to drive the scan lines.

Within the period of $T_3$, the clock signal CLK2 inputs a logic-low voltage from the node "a". Since the transistor DP2 is diode-connected, the node "a" thereof where the clock signal CLK2 is received is equivalent to the cathode of the diode, and the voltage of the node "QB" is pulled down to a logic-low voltage through the transistor DP2 so as to turn on the transistors MP1 and MP3. Since the transistor MP1 is turned on, the voltage of the node "Q" is pulled up to a logic-high voltage such that the transistors MP2 and MP4 are turned off. As the transistor MP3 is turned on, the output signal $NEXT_i$ is changed into a logic-high voltage. Within the period of $T_4$, the clock signals CLK1 and CLK2 input logic-high voltages respectively through the nodes "b" and "a" so as to turn off the transistors MP4 and DP2. Since the voltages of the nodes "Q" and "QB" maintain as the state of $T_3$, the output signal $NEXT_i$ still remains as a logic-high voltage.

Figure 6A:
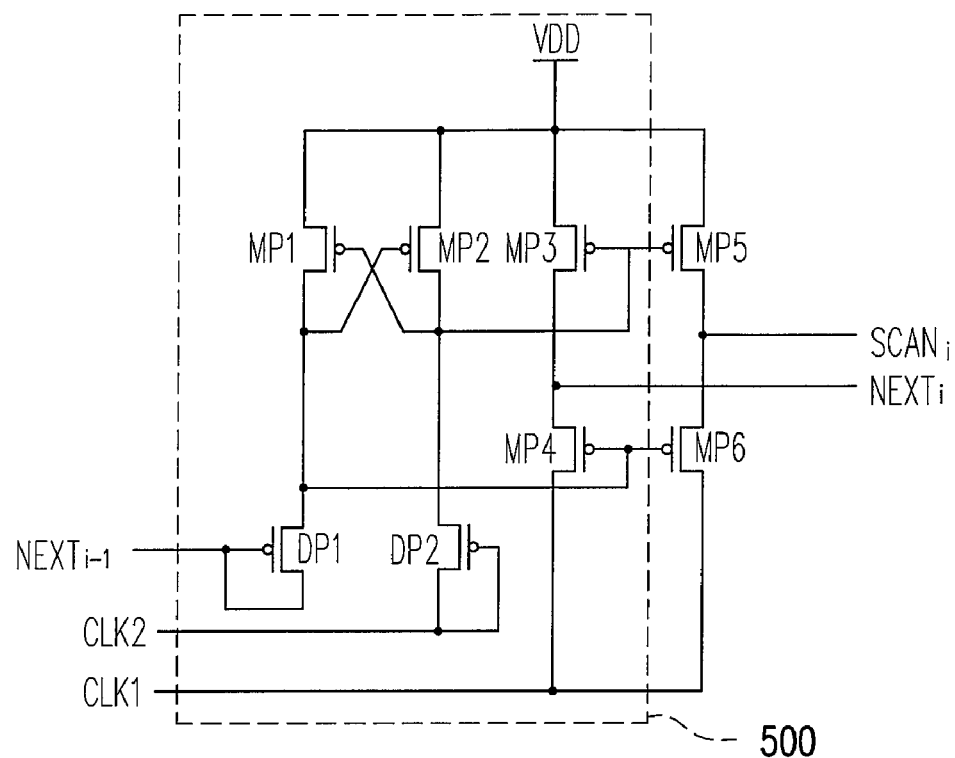
FIG. 6A is a circuit implementation diagram of shift registers 401-403 according to one embodiment of FIG. 4.
Figure 6B:
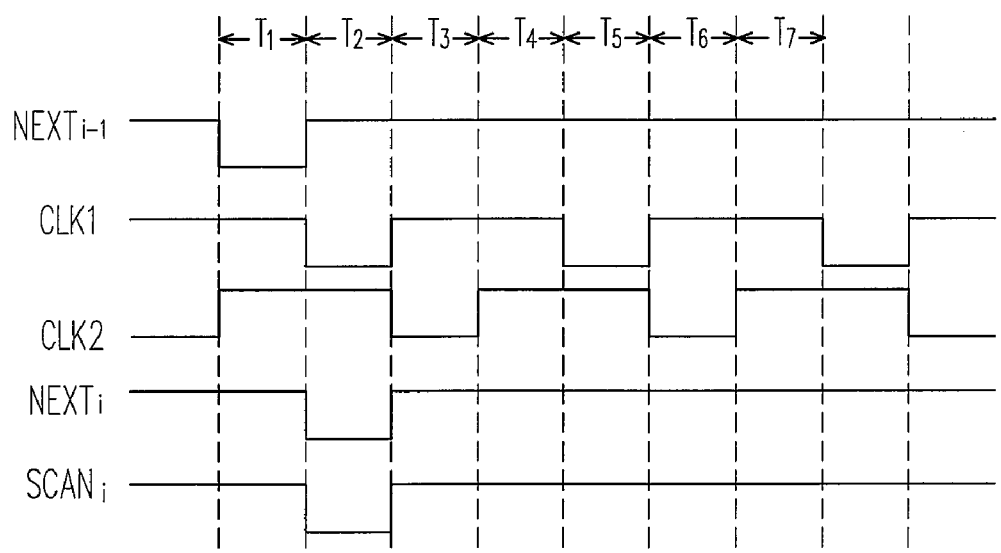
FIG. 6B is a timing diagram of the circuit operation of FIG. 6A.

FIG. 6A is a circuit implementation diagram of the shift registers 401-403 according to the embodiment of FIG. 4. Referring to FIGS. 5A and 6A, the difference between FIGS. 6A and 5A is that the circuit of FIG. 6A further includes transistors MP5-MP6. FIG. 6B is a timing diagram of the circuit operation of FIG. 6A. Referring to FIGS. 6A and 6B, the circuit operation of the transistor MP5 is the same as that of the transistor MP3, and the circuit operation of the transistor MP6 is the same as that of the transistor MP4; hence, an output signal $SCAN_i$ is of the same phase as the output signal $NEXT_i$. If the output signal $NEXT_i$ of the shift register is simultaneously outputted to the next stage shift register and the display panel to drive the scan lines, it may result in that the signal outputted to the next stage shift register influenced by the loading effect such that the operation of the scan driving circuit is rendered abnormal. Therefore, in the present embodiment, the output signal follows two paths. One path is outputting the output signal $SCAN_i$ to the display panel to drive the scan lines, and the other path is outputting the output signal $NEXT_i$ to the next stage shift register.

The foregoing embodiment illustrates a scan driving circuit that can be applied in the LCD. However, the present invention is not limited to the LCD. One embodiment is described in the following to illustrate how the spirit of the present invention may be applied in devices such as an organic light emitting diode (hereinafter referred to as OLED) display device. In order that people skilled in the art may implement the embodiment, the way the pixel units operate in the OLED is explained first before the embodiment is further described.

Figure 7:
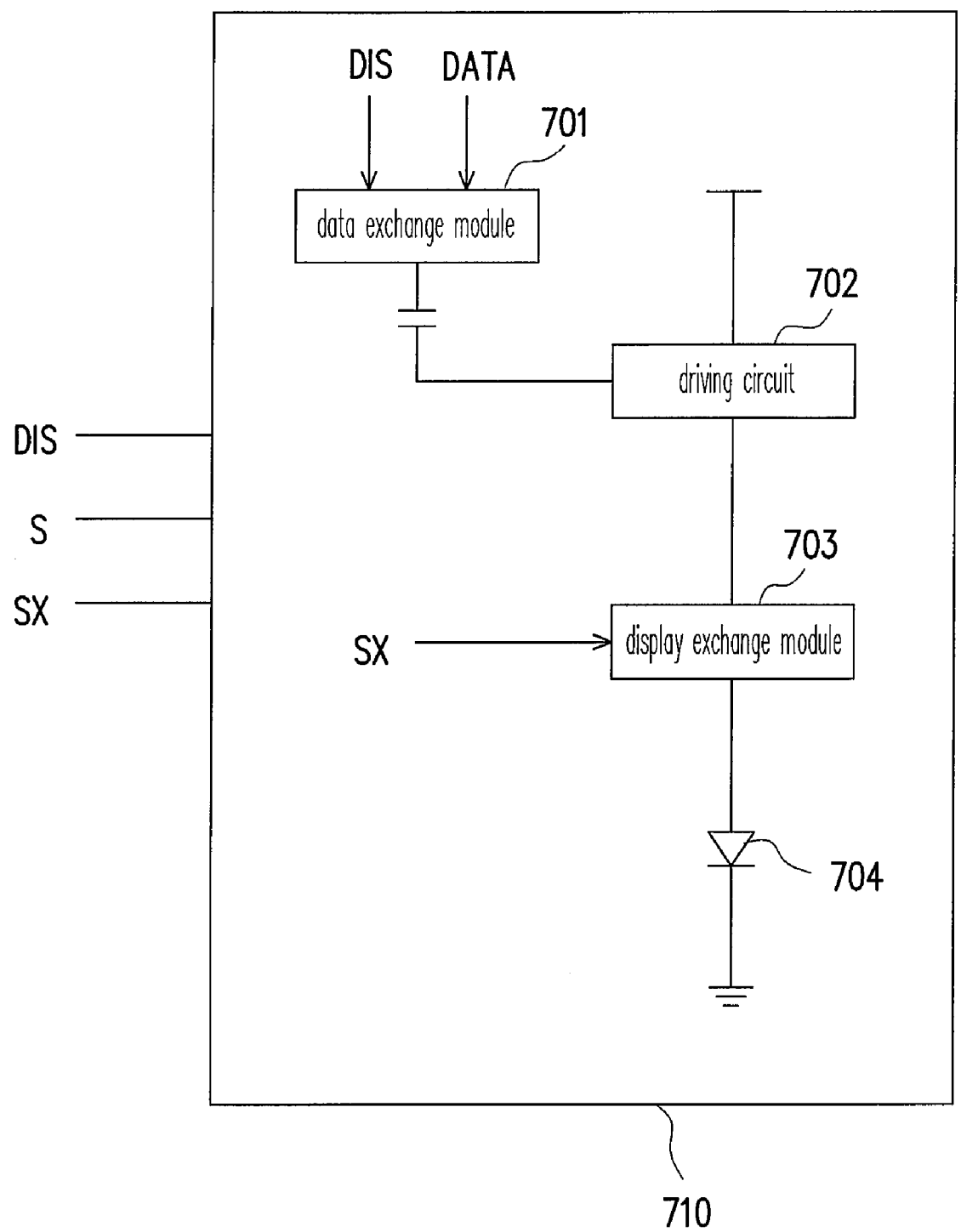
FIG. 7 is a circuit block diagram of a conventional OLED pixel unit.

FIG. 7 is a circuit block diagram of a conventional OLED pixel unit. Referring to FIG. 7, a pixel unit 710 includes a data exchange module 701, a driving circuit 702, a display exchange module 703 and an OLED 704. Signal DATA is the data provided by the data driving circuit of the OLED display device. The data are in the voltage form. The data exchange module 701 stores the signal DATA during a period and then the driving circuit 702 converts the data into a current flow and outputs a signal to the display exchange module 703. As the data exchange module 701 requires a period to store the voltage, the OLED 704 does not need to be driven during this period. The pixel unit 701 utilizes a control signal SX to control whether the display exchange module 703 is turned on so as to determine whether the output signal of the driving circuit 702 drives the OLED 704. Besides, when a frame is updated, the pixel unit 710 utilizes a control signal DIS with a larger duty cycle to control the resetting of the voltage stored in the data exchange module 701.

Since the pixel unit 710 of the OLED requires a control signal to control whether the display exchange module 703 is turned on and another control signal to reset the stored voltage in the data exchange module 701. Hence, the organic light emitting diode (OLED) display panel is taken as the display panel 301 in the embodiment of FIG. 3 in the following embodiment, and likewise the scan driving circuit 303 is taken as the example for the following embodiment. The structure of the scan driving circuit 303 is the same as that shown in the embodiment of FIG. 4.

Figure 8A:
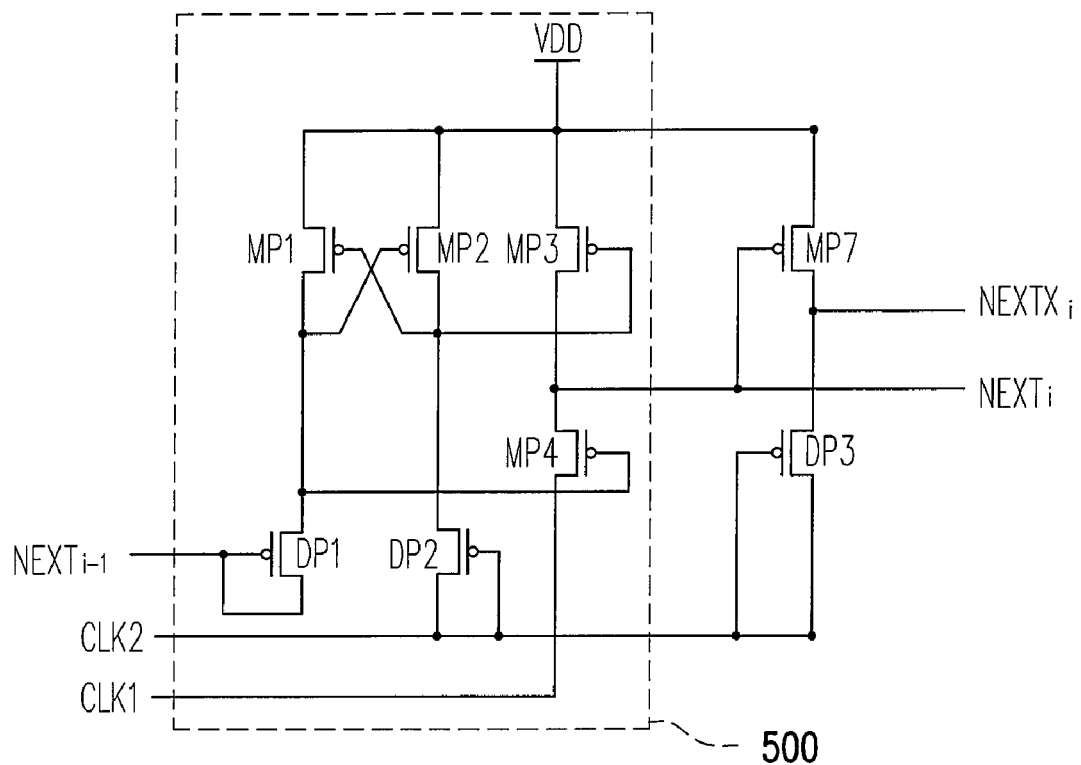
FIG. 8A is another circuit implementation diagram of the shift registers 401-403 according to the embodiment of FIG. 4.
Figure 8B:
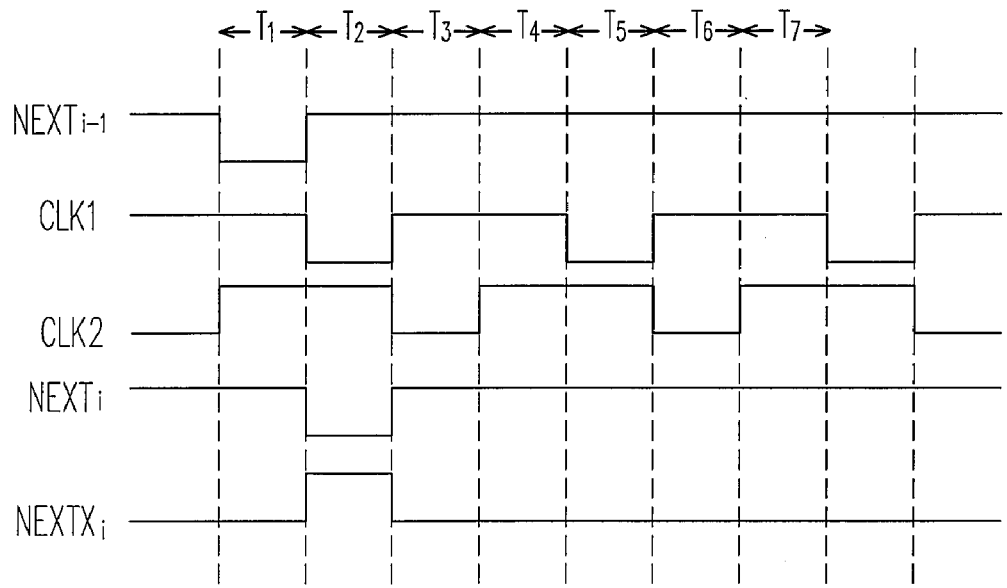
FIG. 8B is a timing diagram of the circuit operation of FIG. 8A.

FIG. 8A is a circuit implementation diagram of the shift registers 401-403 according to the embodiment of FIG. 4. Referring to FIGS. 5A and 8A, the difference between FIGS. 8A and 5A is that the circuit of FIG. 8A further includes transistors MP7 and DP3. FIG. 8B is a timing diagram of the circuit operation of FIG. 8A. Referring to FIGS. 8A and 8B, within the period of $T_2$, the output signal $NEXT_i$ is a logic-low voltage, and the transistor MP7 is turned on. As a result, an output signal $NEXTX_i$ is pulled up to a logic-high voltage. Within the period of $T_3$, the output signal $NEXT_i$ is a logic-high voltage, the transistor MP7 is turned off, and the transistor DP3 is turned on because the clock signal CLK2 inputs a logic-low voltage. As a result, the output signal $NEXTX_i$ is pulled down to a logic-low voltage. Within the period of $T_4$, the output signal $NEXT_i$ is a logic-high voltage, the transistor MP7 is turned off, and the transistor DP3 is turned off because the clock signal CLK2 inputs a logic-high voltage. As a result, the output signal $NEXTX_i$ maintains at a logic-low voltage. As shown in FIG. 8B, the output signal $NEXTX_i$ is a complementary signal corresponding to the output signal $NEXT_i$. The output signals $NEXTX_i$ and $NEXT_i$ are out of phase. The purpose of the present embodiment is outputting the output signal $NEXT_i$ to the next stage shift register and the display panel to drive the pixel unit 710, and also utilizing the output signal $NEXTX_i$ to control whether the display exchange module 703 is turned on.

Figure 9A:
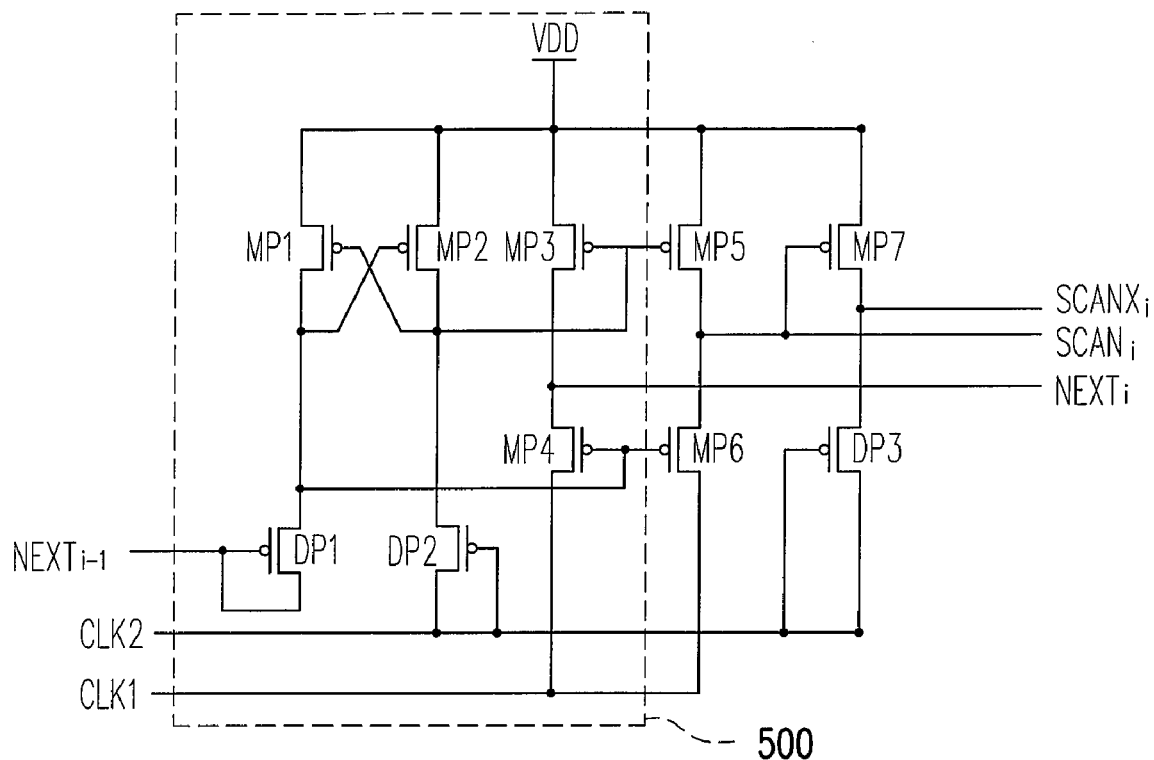
FIG. 9A is another circuit implementation diagram of the shift registers 401-403 according to the embodiment of FIG. 4.
Figure 9B:
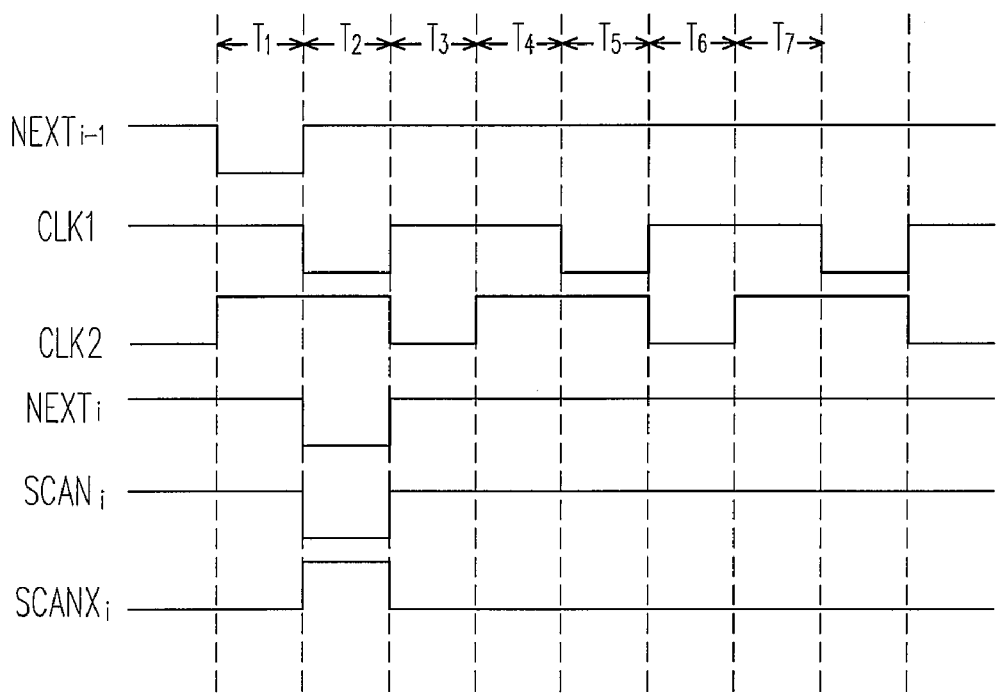
FIG. 9B is a timing diagram of the circuit operation of FIG. 9A.

FIG. 9A is a circuit implementation diagram of the shift registers 401-403 according to the embodiment of FIG. 4. Referring to FIGS. 5A and 9A, the difference between FIGS. 9A and 5A is that the circuit of FIG. 9A further includes transistors MP5-MP7 and DP3. FIG. 9B is a timing diagram of the circuit operation of FIG. 9A. Referring to FIGS. 9A and 9B, the circuit operation of the transistor MP5 is the same as that of the transistor MP3, and the circuit operation of the transistor MP6 is the same as that of the transistor MP4; hence, the output signal $SCAN_i$ and $NEXT_i$ are in phase. The circuit operations of the transistors MP7 and DP3 are the same as the descriptions for FIGS. 8A and 8B. The difference is that the outputted $SCANX_i$ and $SCAN_i$ are out of phase. The purpose of the present embodiment is outputting the output signal $SCAN_i$ to the display panel to drive the pixel unit 710 with consideration of the influence of the loading effect, outputting the output signal $NEXT_i$ to the next stage shift register, and utilizing the output signal $SCANX_i$ to control whether the display exchange module 703 is turned on.

People who are ordinarily skilled in the art should know the function of the transistors MP7 and DP3 in the embodiments of FIGS. 8A and 9A is in fact equivalent to that of an inverter. Therefore, those ordinarily skilled in the art can replace the transistors MP7 and DP3 with an inverter through the teachings of the embodiment. The invention is thus not limited to the embodiment.

Figure 10A:
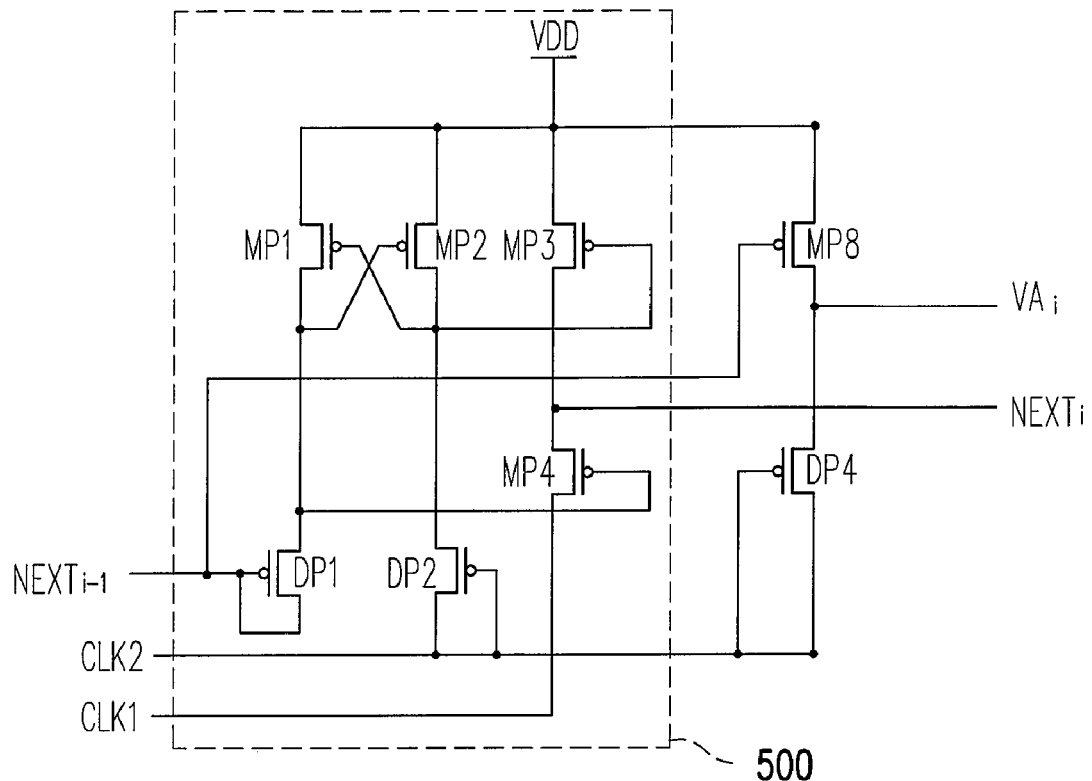
FIG. 10A is a circuit implementation diagram of the shift registers 401-403 according to the embodiment of FIG. 4.
Figure 10B:
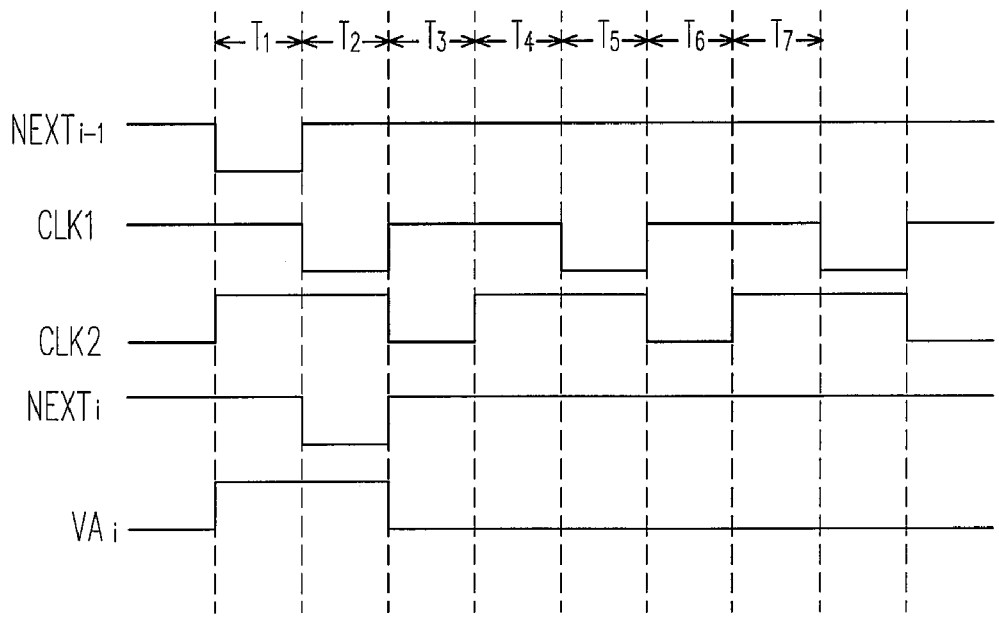
FIG. 10B is a timing diagram of the circuit operation of FIG. 1A.

FIG. 10A is a circuit implementation diagram of the shift registers 401-403 according to the embodiment of FIG. 4. Referring to FIGS. 5A and 10A, the difference between FIGS. 10A and 5A is that the circuit of FIG. 10A further includes transistors MP8 and DP4. FIG. 10B is a timing diagram of the circuit operation of FIG. 10A. Referring to FIGS. 10A and 10B, within the period of $T_1$, the input signal $NEXT_{i-1}$ is a logic-low voltage, the transistor MP8 is turned on, and an output signal $VA_i$ is pulled up to a logic-high voltage. Until within the period of $T_3$, the clock signal CLK2 is inputted as a logic-low voltage to make the transistor DP4 turned on, thus the output signal $VA_i$ is pulled down to a logic-low voltage. As shown in FIG. 10B, the output signal $VA_i$ is a signal with a double duty cycle than the input signal $NEXT_{i-1}$. The purpose of the present embodiment is providing the control signal $VA_i$ with the double duty cycle to reset the stored voltage in the data exchange module 701.

In the foregoing description of the embodiment, the transistors DP1-DP4 utilize the gate/drain of the P-type MOSFET for coupling; they are rectifying elements using a diode connection method. Hence, people ordinarily skilled in the art can use a diode, an diode-connected N-type MOSFET or a common PN junction diode to substitute for the transistors DP1-DP4 through the teachings of the embodiments of the invention. The details are not to be reiterated herein.

It is noted that the shift register of the foregoing embodiment is employed by a P-type MOSFET. Nevertheless, other elements may be selected depending on the user's needs and the characteristics of an element, such as an N-type MOSFET. Another embodiment is described in the following so that people ordinarily skilled in the art can easily implement the present invention.

Figure 11A:
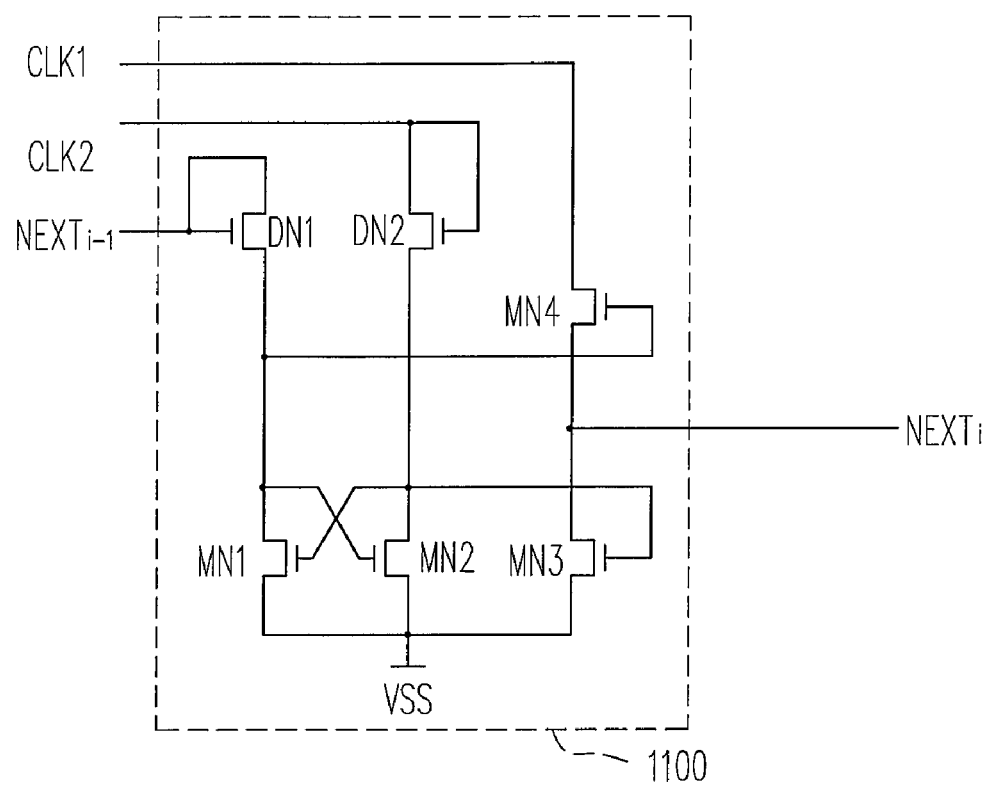
FIG. 11A is another circuit implementation diagram of the shift registers 401-403 according to the embodiment of FIG. 4.
Figure 11B:
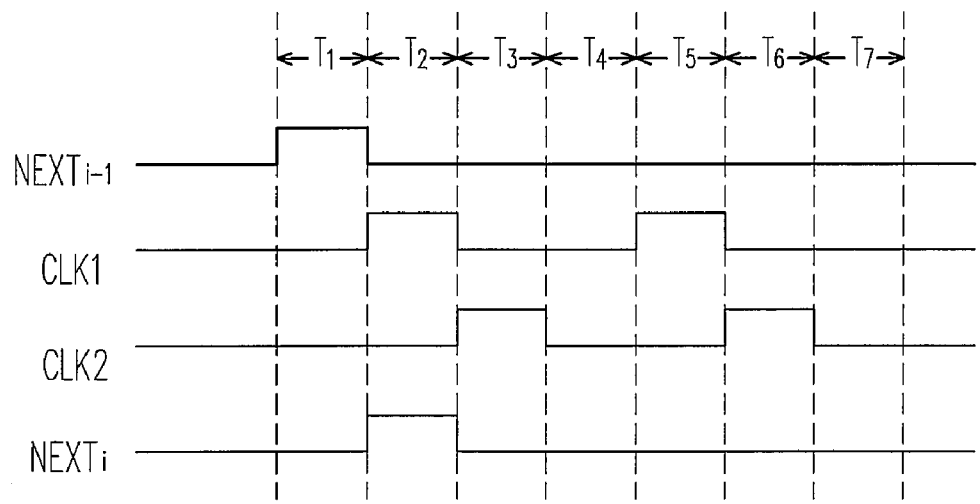
FIG. 11B is a timing diagram of the circuit operation of FIG. 11A.

FIG. 11A is a circuit implementation diagram of the shift registers 401-403 according to the embodiment of FIG. 4. Referring to FIGS. 5A and 11A, the difference between FIGS. 11A and 5A is that a shift register 1100 of FIG. 11A is employed by an N-type MOSFET, and it includes transistors MN1-MN4 and DN1-DN2. FIG. 11B is a timing diagram of the circuit operation of FIG. 11A. Referring to FIGS. 11A, 11B, 5A and 5B, those ordinarily skilled in the art can know that since the transistors constituting the circuit of FIG. 11A are exemplified as the N-type transistors of FIG. 5A, the voltage levels of the input signals, the clock signals and the output signals in FIG. 11B are opposite to the voltage levels of those corresponding signals in FIG. 5B respectively. Additionally, as the circuit of FIG. 11A utilizes N-type transistors, a ground voltage is used for a common voltage VSS in the embodiment of FIG. 11A.

Figure 12A:
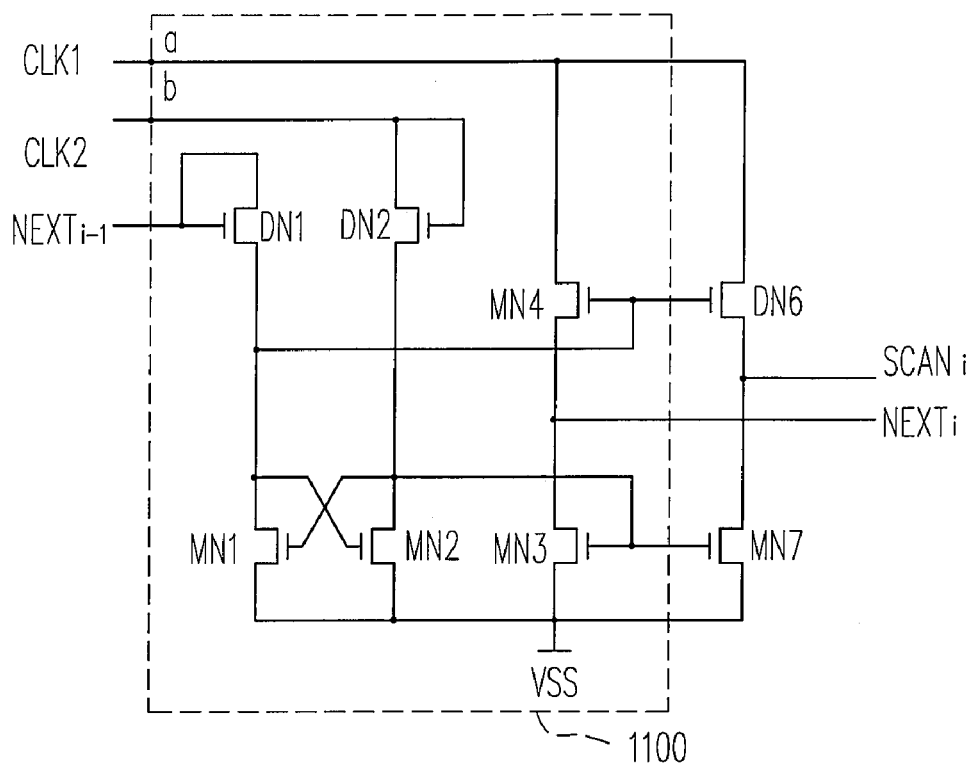
FIG. 12A is another circuit implementation diagram of the shift registers 401-403 according to the embodiment of FIG. 4.
Figure 12B:
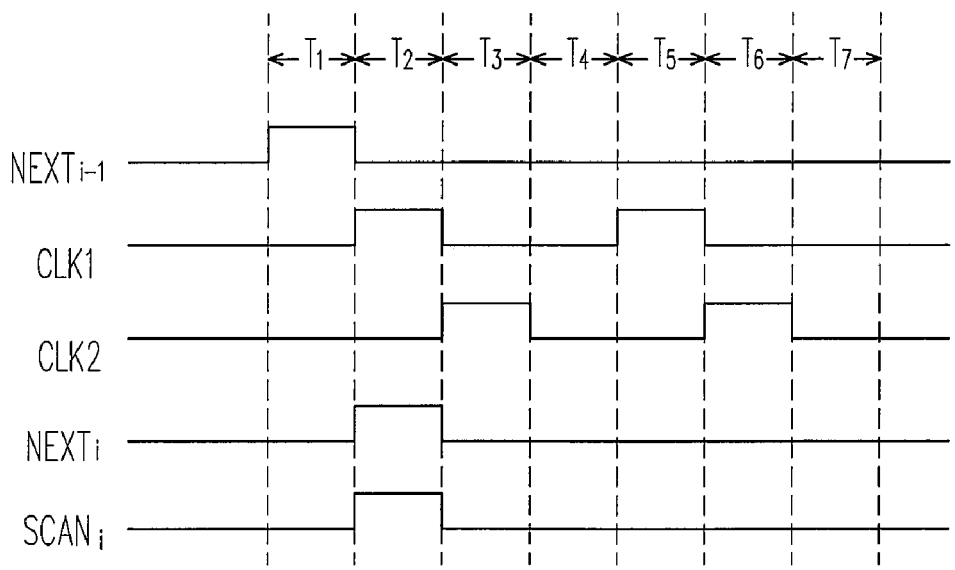
FIG. 12B is a timing diagram of the circuit operation of FIG. 12A.

FIG. 12A is a circuit implementation diagram of the shift registers 401-403 according to the embodiment of FIG. 4. Referring to FIGS. 11A and 12A, the difference between the circuit of FIG. 12A and the circuit of FIG. 11A is that the circuit of FIG. 12A further includes transistors MN5-MN6. FIG. 12B is a timing diagram of the circuit operation of FIG. 12A. Referring to FIGS. 12A, 12B, 6A and 6B, those ordinarily skilled in the art can know that since the transistors constituting the circuit of FIG. 12A are exemplified as the N-type transistors of FIG. 6A, the voltage levels of the input signals, the clock signals and the output signals in FIG. 12B are opposite to the voltage levels of those corresponding signals in FIG. 6B respectively. The purpose of the present embodiment is outputting the output signal $SCAN_i$ to the display panel to drive the scan lines and outputting the output signal $NEXT_i$ to the next stage shift register with consideration of the influence of the loading effect.

Figure 13A:
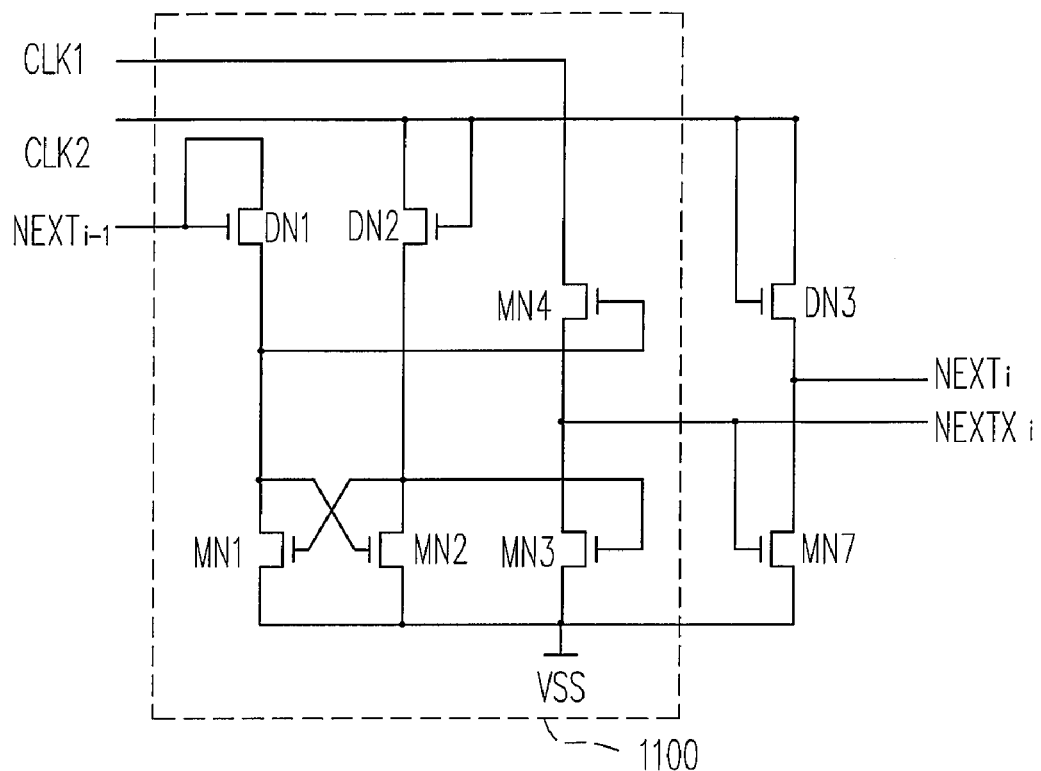
FIG. 13A is another circuit implementation diagram of the shift registers 401-403 according to the embodiment of FIG. 4.
Figure 13B:
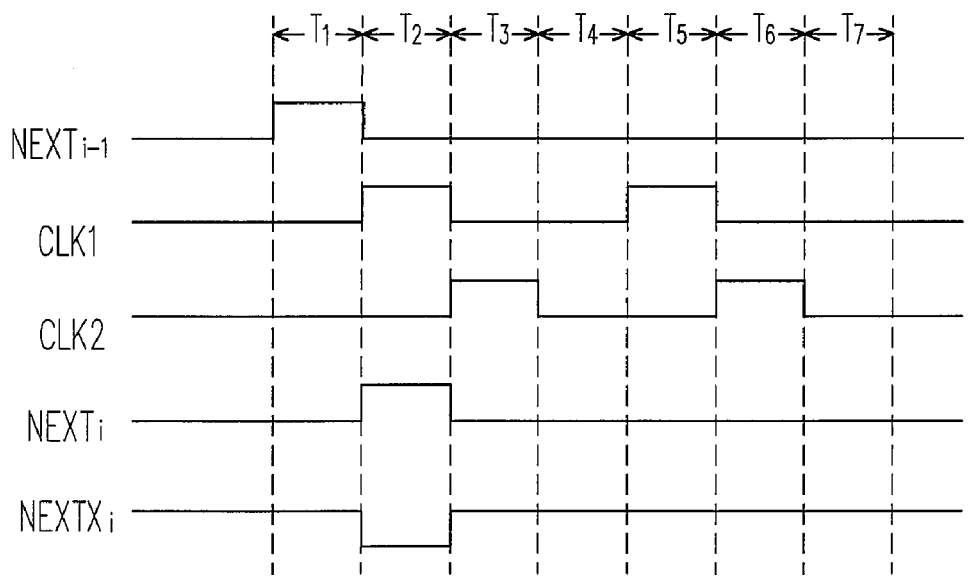
FIG. 13B is a timing diagram of the circuit operation of FIG. 13A.

FIG. 13A is a circuit implementation diagram of the shift registers 401-403 according to the embodiment of FIG. 4. Referring to FIGS. 11A and 13A, the difference between the circuit of FIG. 13A and the circuit of FIG. 11A is that the shift register 1100 of FIG. 13A further includes transistors MN7 and DN3. FIG. 13B is a timing diagram of the circuit operation of FIG. 13A. Referring to FIGS. 13A, 13B, 8A and 8B, those ordinarily skilled in the art can know that since the transistors constituting the circuit of FIG. 13A are exemplified as the N-type transistors of FIG. 8A, the voltage levels of the input signals, the clock signals and the output signals in FIG. 13B are opposite to the voltage levels of those corresponding signals in FIG. 8B respectively. The present embodiment aims at outputting from different designs of the driving circuit of the display device, such as the scan driving circuit of the OLED, the output signal $NEXT_i$ to the OLED display panel to drive the pixel unit thereof and to the next stage shift register, and providing alternatively a complementary output signal $NEXTX_i$ wherein the output signal $NEXTX_i$ and $NEXT_i$ are out of phase.

Figure 14A:
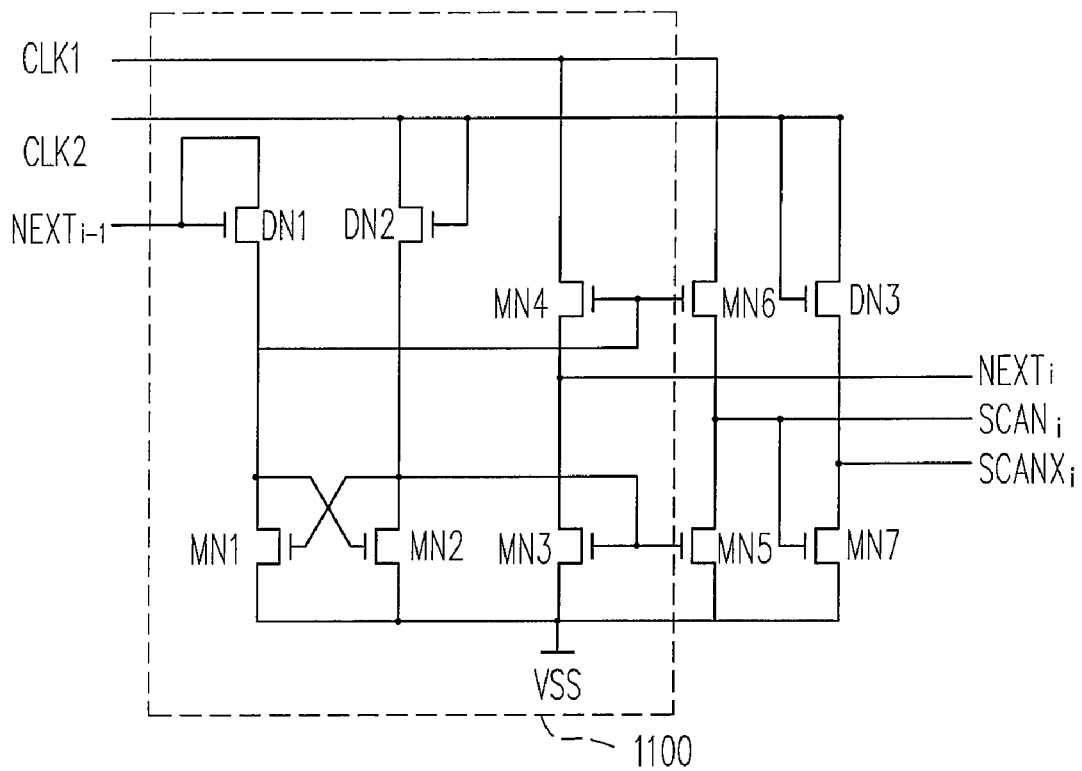
FIG. 14A is another circuit implementation diagram of the shift registers 401-403 according to the embodiment of FIG. 4.
Figure 14B:
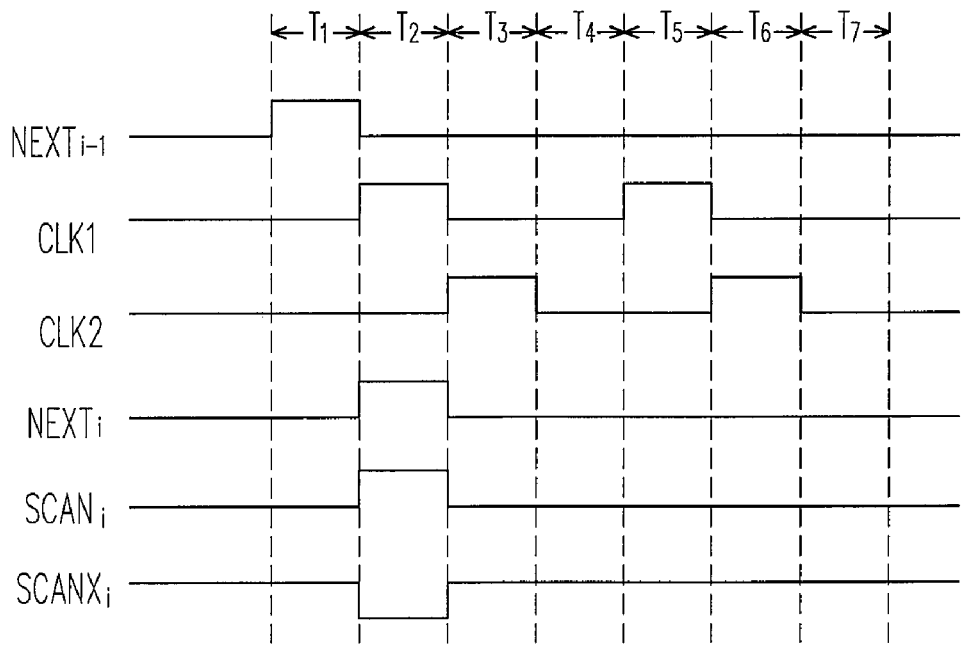
FIG. 14B is a timing diagram of the circuit operation of FIG. 14A.

FIG. 14A is a circuit implementation diagram of the shift registers 401-403 according to the embodiment of FIG. 4. Referring to FIGS. 11A and 14A, the difference between the circuit of FIG. 14A and the circuit of FIG. 11A is that the shift register 1100 of FIG. 14A further includes transistors MN5-MN7 and DN3. FIG. 14B is a timing diagram of the circuit operation of FIG. 14A. Referring to FIGS. 14A, 14B, 9A and 9B, those ordinarily skilled in the art can know that since the transistors constituting the circuit of FIG. 14A are exemplified as the N-type transistors of FIG. 9A, the voltage levels of the input signals, the clock signals and the output signals in FIG. 14B are opposite to the voltage levels of those corresponding signals in FIG. 9B respectively. The present embodiment aims at outputting from different designs of the driving circuit of the display device, such as the scan driving circuit of the OLED, the output signal $SCAN_i$ to the OLED display panel to drive the pixel unit thereof, outputting the output signal $NEXT_i$ to the next stage shift register, and providing alternatively a complementary output signal $SCANX_i$ with consideration of the influence of the loading effect, wherein the output signal $SCANX_i$ and $SCAN_i$ are out of phase.

Those ordinarily skilled in the art should know that the function of the transistors MN7 and DN3 of the embodiments of FIGS. 13A and 14A is in fact equivalent to that of an inverter. Therefore, those ordinarily skilled in the art can replace the transistors MN7 and DN3 with an inverter through the teachings of the embodiment. The invention is not limited to the embodiment.

Figure 15A:
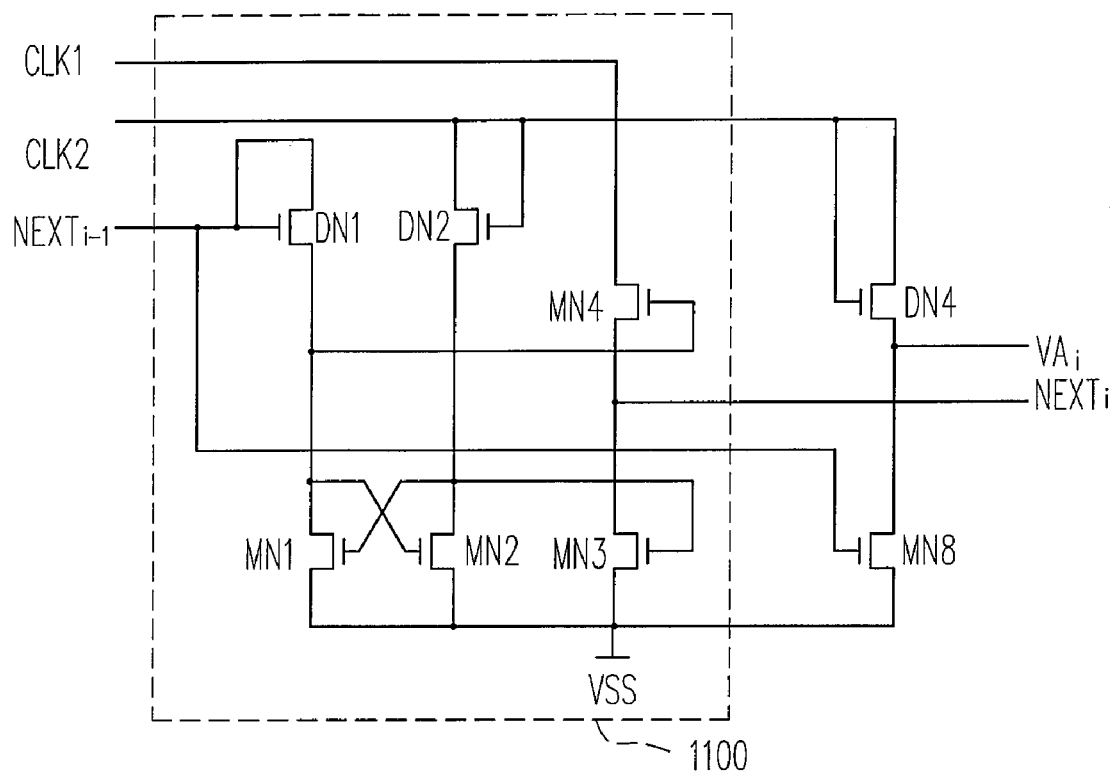
FIG. 15A is another circuit implementation diagram of the shift registers 401-403 according to the embodiment of FIG. 4.
Figure 15B:
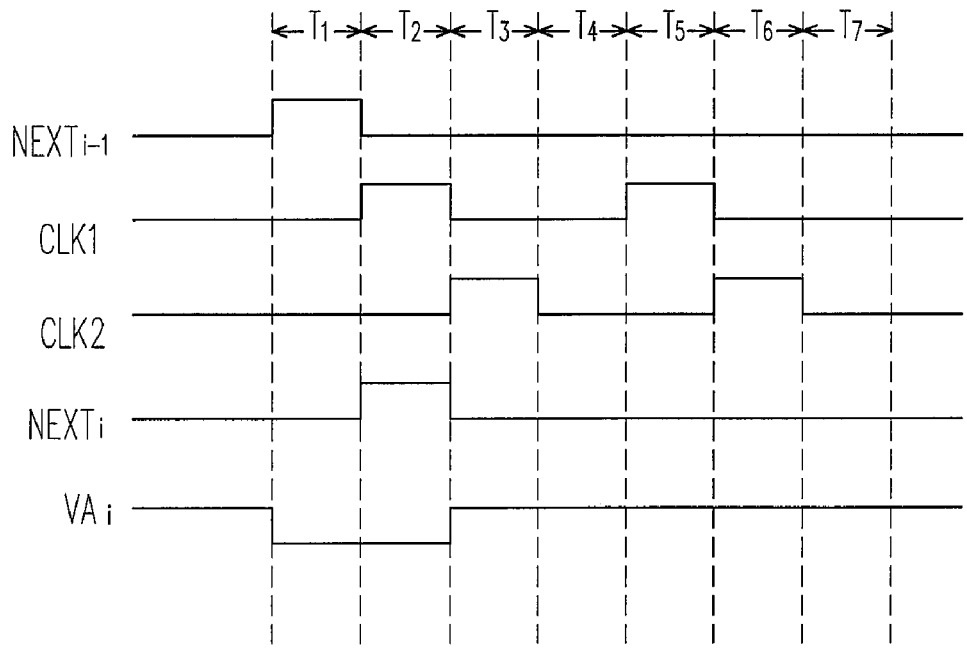
FIG. 15B is a timing diagram of the circuit operation of FIG. 15A.

FIG. 15A is a circuit implementation diagram of the shift registers 401-403 according to the embodiment of FIG. 4. Referring to FIGS. 11A and 15A, the difference between the circuit of FIG. 15A and the circuit of FIG. 11A is that the shift register 1100 of FIG. 15A further includes transistors MN8 and DN4. FIG. 15B is a timing diagram of the circuit operation of FIG. 15A. Referring to FIGS. 15A, 15B, 10A and 10B, those ordinarily skilled in the art can know that since the transistors constituting the circuit of FIG. 15A are exemplified as the N-type transistors of FIG. 10A, the voltage levels of the input signals, the clock signals and the output signals in FIG. 15B are opposite to the voltage levels of those corresponding signals in FIG. 10B respectively. The present embodiment aims at outputting from different designs of the driving circuit of the display device, such as the scan driving circuit of the OLED display device, the output signal $NEXT_i$ to the OLED display panel to drive the pixel unit thereof and to the next stage shift register, and providing alternatively a complementary output signal $VA_i$ with a double duty cycle than the input signal $NEXT_{i-1}$.

In the foregoing descriptions of the embodiments, the transistors DN1-DN4 utilize the diode-connected N-type MOSFET; they are rectifying elements using a diode connection method. Hence, people ordinarily skilled in the art can replace the transistors DN1-DN4 with a diode or a diode-connected P-type MOSFET.

Figure 16:
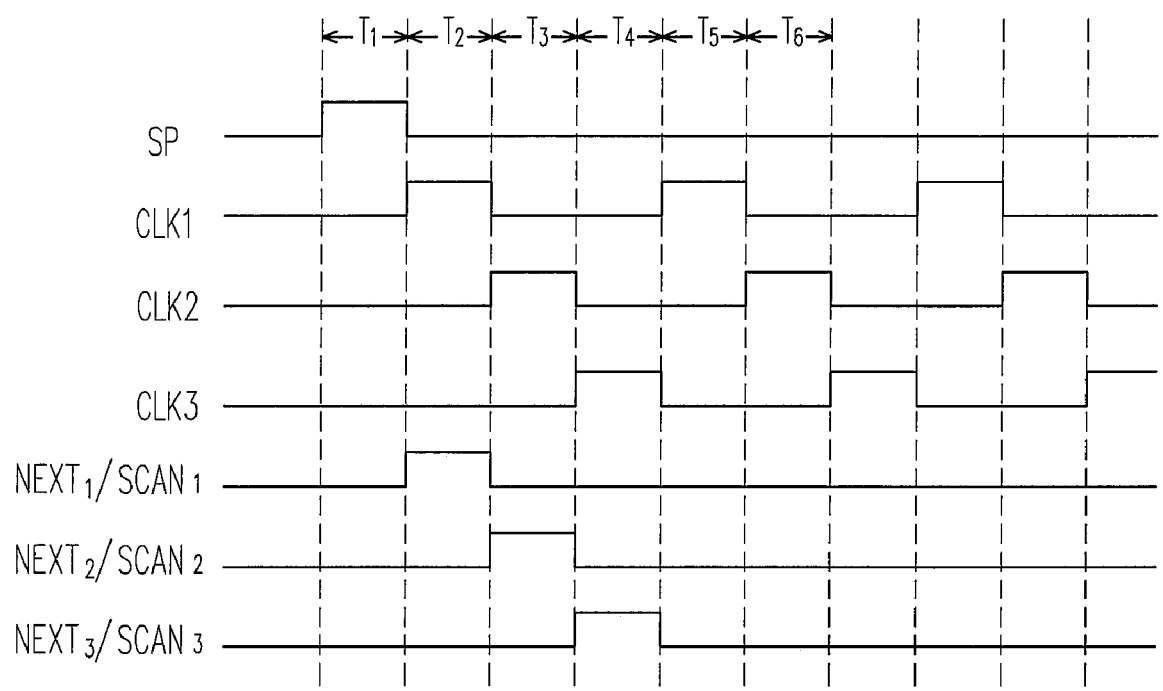
FIG. 16 is a timing diagram of the circuit operation of FIG. 4.

FIG. 16 is a timing diagram of the circuit operation of FIG. 4. Referring to FIGS. 4 and 16, the shift registers 401-403 respectively utilize the circuit of FIG. 6A as an example to describe the spirit of the invention. The first stage shift register 401 receives the scan driving signal SP, utilizes the clock signals CLK1 and CLK2 to output a signal $NEXT_1$ through the input nodes "a" and "b" within the period of $T_2$ to the shift register 402, and outputs a signal $SCAN_1$ to the display panel to drive the scan lines. The second stage shift register 402 receives the output signal $NEXT_1$ outputted from the last stage shift register 401, utilizes the clock signals CLK2 and CLK3 to output an output signal $NEXT_2$ through the input nodes "a" and "b" of the shift register 402 within the period of $T_3$, and outputs a signal $SCAN_2$ to the display panel to drive the scan lines. The third stage shift register 403 receives the output signal $NEXT_2$ outputted from the last stage shift register 402, utilizes the clock signals CLK3 and CLK1 to output a signal NEXT₃ through the input nodes "a" and "b" of the shift register 403 within the period of T₄, and outputs a signal SCAN₃ to the display panel to drive the scan lines.

Although only the circuit of FIG. 6A is taken as an example, the invention is not limited to the example. Any person ordinarily skilled in the art should know from the teachings of the foregoing embodiment that according to different occasions of application, the shift registers of FIG. 4 may utilize the circuits of FIGS. 5A, 8A, 9A, 10A, 11A, 12A, 13A, 14A and 15A to implementation.

Moreover, the data driving circuit 304 of the embodiment in FIG. 3 may be implemented by the shift registers of FIGS. 5A, 8A, 9A, 10A, 11A, 12A, 13A, 14A and 15A. The only difference is in the different occasions of application. In the data driving circuit 304, the function of the shift registers is transmitting pixel data to the next stage shift register through controlling the clock signals. The present invention is not limited to application in the scan driving circuit.

In summary, the advantages of the present invention at least include the following:

1. A single shift register utilizes 2 sets of clock signals to control the output of the output signals and reduces the number of clock control signals and the complexity and the area of the wiring in the hardware.

2. A driving circuit constituted by a plurality of shift registers and the display device using the driving circuit utilizes 3 sets of clock signals to control the output of the output signals so as to reduce the number of the clock control signals and the complexity and the area of the wiring in the hardware.

The embodiments of the invention further include the following advantages:

1. With consideration of the loading effect of resistance-capacitance, a shift register, a driving circuit constituted by a plurality of shift registers and a display device using the driving circuit have two paths to output signals. One is outputting the signals to drive the scan lines of the display panel (or other devices), and the other is transmitting the signals to the next stage shift register.

2. A shift register, a driving circuit constituted by a plurality of shift registers and a display device utilizing the driving circuit provide a complementary signal or a signal with a double duty cycle.

3. Appropriate elements are selected considering the needs of the user and the characteristics of the elements. For example, a shift register employed by the whole P-type MOS-FET may be applied in a driving circuit which is designed to be disposed on the glass substrate of a display panel.

It will be apparent to those skilled in the art that various modifications, and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A shift register comprising:
   a first rectifying element, a first terminal thereof directly coupled to a first input node;
   a second rectifying element, a first terminal thereof directly coupled to a second input node;
   a first transistor, a first source/drain thereof directly coupled to a common voltage, a gate thereof directly coupled to a second terminal of the second rectifying element, a second source/drain thereof directly coupled to a second terminal of the first rectifying element;
   a second transistor, a first source/drain thereof directly coupled to the common voltage, a gate thereof directly coupled to the second terminal of the first rectifying element, a second source/drain thereof directly coupled to the second terminal of the second rectifying element;
   a third transistor, a first source/drain thereof directly coupled to the common voltage, a gate thereof directly coupled to the second terminal of the second rectifying element, a second source/drain thereof directly coupled to a first output node; and
   a fourth transistor, a first source/drain thereof directly coupled to the first output node, a gate thereof directly coupled to the second terminal of the first rectifying element, a second source/drain directly thereof coupled to a third input node.

2. The shift register of claim 1 further comprising:
   a fifth transistor, a first source/drain thereof directly coupled to the common voltage, a gate thereof directly coupled to the second terminal of the second rectifying element, a second source/drain thereof directly coupled to a second output node; and
   a sixth transistor, a first source/drain thereof directly coupled to the second output node, a gate thereof directly coupled to the second terminal of the first rectifying element, and a second source/drain thereof directly coupled to the third input node.

3. The shift register of claim 2 further comprising:
   an inverter, an input terminal thereof directly coupled to the second output node, an output terminal thereof directly coupled to a third output node.

4. The shift register of claim 3, wherein the inverter comprises:
   a seventh transistor, a first source/drain thereof directly coupled to the common voltage, a gate thereof directly coupled to the second output node, a second source/drain thereof directly coupled to the third output node; and
   a third rectifying element, a first terminal thereof directly coupled to the second input node, a second terminal thereof directly coupled to the third output node.

5. The shift register of claim 1 further comprising:
   an inverter, an input terminal thereof directly coupled to the first output node, an output terminal thereof directly coupled to a third output node.

6. The shift register of claim 5, wherein the inverter comprises:
   a seventh transistor, a first source/drain thereof directly coupled to the common voltage, a gate thereof directly coupled to the first output node, a second source/drain thereof directly coupled to the third output node; and
   a third rectifying element, a first terminal thereof directly coupled to the second input node, a second terminal thereof directly coupled to the third output node.

7. The shift register of claim 1 further comprising:
   an eighth transistor, a first source/drain thereof directly coupled to the common voltage, a gate thereof directly coupled to the first input node, a second source/drain thereof directly coupled to a fourth output node; and
   a fourth rectifying element, a first terminal thereof directly coupled to the second input node, a second terminal thereof directly coupled to the fourth output node.

8. The shift register of claim 1, wherein the common voltage is a power source voltage, and the first to the fourth transistors are P-type transistors.

9. The shift register of claim 8, wherein the first rectifying element is a P-type transistor, a gate and a first source/drain thereof directly coupled to the first terminal of the first rectifying element, and a second source/drain thereof directly coupled to the second terminal of the first rectifying element.

10. The shift register of claim 8, wherein the second rectifying element is a P-type transistor, a gate and a first source/drain thereof directly coupled to the first terminal of the second rectifying element, and a second source/drain thereof directly coupled to the second terminal of the second rectifying element.

11. The shift register of claim 1, wherein the common voltage is a ground voltage, and the first to the fourth transistors are N-type transistors.

12. The shift register of claim 11, wherein the first rectifying element is an N-type transistor, a gate and a first source/drain thereof directly coupled to the first terminal of the first rectifying element, and a second source/drain thereof directly coupled to the second terminal of the first rectifying element.

13. The shift register of claim 11, wherein the second rectifying element is an N-type transistor, a gate and a first source/drain thereof directly coupled to the first terminal of the second rectifying element, and a second source/drain thereof directly coupled to the second terminal of the second rectifying element.

14. A driving circuit comprising:
a plurality of shift registers, wherein each of the shift registers comprises:
a first rectifying element, a first terminal of the first rectifying element directly coupled to a first input node;
a second rectifying element, a first terminal thereof directly coupled to a second input node;
a first transistor, a first source/drain thereof directly coupled to a common voltage, a gate thereof directly coupled to a second terminal of the second rectifying element, a second source/drain thereof directly coupled to a second terminal of the first rectifying element;
a second transistor, a first source/drain thereof directly coupled to the common voltage, a gate thereof directly coupled to the second terminal of the first rectifying element, a second source/drain thereof directly coupled to the second terminal of the second rectifying element;
a third transistor, a first source/drain thereof directly coupled to the common voltage, a gate thereof directly coupled to the second terminal of the second rectifying element, a second source/drain thereof directly coupled to a first output node; and
a fourth transistor, a first source/drain thereof directly coupled to the first output node, a gate thereof directly coupled to the second terminal of the first rectifying element, and a second source/drain thereof directly coupled to a third input node;
wherein the first input node of an $(i+1)^{th}$ shift register is directly coupled to the first output node of an $i^{th}$ shift register, the driving circuit is controlled by a first to a third clock signals to determine the output of the driving circuit, where i is a non-zero natural number.

15. The driving circuit of claim 14, wherein each of the shift registers further comprises:
a fifth transistor, a first source/drain thereof directly coupled to the common voltage, a gate thereof directly coupled to the second terminal of the second rectifying element, a second source/drain thereof directly coupled to a second output node; and
a sixth transistor, a first source/drain thereof directly coupled to the second output node, a gate thereof directly coupled to the second terminal of the first rectifying element, and a second source/drain thereof directly coupled to the third input node.

16. The driving circuit of claim 15, wherein each of the shift registers further comprises:
an inverter, an input terminal of the inverter directly coupled to the second output node, and an output terminal thereof directly coupled to a third output node.

17. The driving circuit of claim 16, wherein the inverter comprises:
a seventh transistor, a first source/drain thereof directly coupled to the common voltage, a gate thereof directly coupled to the second output node, a second source/drain thereof directly coupled to the third output node; and
a third rectifying element, a first terminal thereof directly coupled to the second input node, a second terminal thereof directly coupled to the third output node.

18. The driving circuit of claim 14, wherein each of the shift registers further comprises:
an inverter, an input terminal of the inverter directly coupled to the first output node, and an output terminal thereof directly coupled to a third output node.

19. The driving circuit of claim 18, wherein the inverter comprises:
a seventh transistor, a first source/drain thereof directly coupled to the common voltage, a gate thereof directly coupled to the first output node, a second source/drain thereof directly coupled to the third output node; and
a third rectifying element, a first terminal thereof directly coupled to the second input node, and a second terminal thereof directly coupled to the third output node.

20. The driving circuit of claim 14, wherein each of the shift registers further comprises:
an eighth transistor, a first source/drain thereof directly coupled to the common voltage, a gate thereof directly coupled to the first input node, a second source/drain thereof directly coupled to a fourth output node; and
a fourth rectifying element, a first terminal thereof directly coupled to the second input node, and a second terminal thereof directly coupled to the fourth output node.

21. The driving circuit of claim 14, wherein the common voltage is a power source voltage, and the first to the fourth transistors are P-type transistors.

22. The driving circuit of claim 21, wherein the first rectifying element is a P-type transistor, a gate and a first source/drain thereof directly coupled to the first terminal of the first rectifying element, and a second source/drain thereof directly coupled to the second terminal of the first rectifying element.

23. The driving circuit of claim 21, wherein the second rectifying element is a P-type transistor, a gate and a first source/drain thereof directly coupled to the first terminal of the second rectifying element, and a second source/drain thereof directly coupled to the second terminal of the second rectifying element.

24. The driving circuit of claim 14, wherein the common voltage is a ground voltage, and the first to the fourth transistors are N-type transistors.

25. The driving circuit of claim 24, wherein the first rectifying element is an N-type transistor, a gate and a first source/drain thereof directly coupled to the first terminal of the first rectifying element, and a second source/drain thereof directly coupled to the second terminal of the first rectifying element.

26. The driving circuit of claim 24, wherein the second rectifying element is a N-type transistor, a gate and a first source/drain thereof directly coupled to the first terminal of the second rectifying element, and a second source/drain thereof directly coupled to the second terminal of the second rectifying element.

27. A display device, comprising:
at least a scan driving circuit and a data driving circuit, the driving circuits comprising a plurality of shift registers, wherein each of the shift registers comprises:
a first rectifying element, a first terminal thereof directly coupled to a first input node;
a second rectifying element, a first terminal thereof directly coupled to a second input node;
a first transistor, a first source/drain thereof directly coupled to a common voltage, a gate thereof directly coupled to a second terminal of the second rectifying element, a second source/drain thereof directly coupled to a second terminal of the first rectifying element;
a second transistor, a first source/drain thereof directly coupled to the common voltage, a gate thereof directly coupled to the second terminal of the first rectifying element, a second source/drain thereof directly coupled to the second terminal of the second rectifying element;
a third transistor, a first source/drain thereof directly coupled to the common voltage, a gate thereof directly coupled to the second terminal of the second rectifying element, a second source/drain thereof directly coupled to a first output node; and
a fourth transistor, a first source/drain thereof directly coupled to the first output node, a gate thereof directly coupled to the second terminal of the first rectifying element, and a second source/drain thereof directly coupled to a third input node;
wherein a first input node of an $(i+1)^{th}$ shift register is directly coupled to a first output node of an $i^{th}$ shift register, the driving circuit is controlled by a first to a third clock signals to determine the output of the driving circuit, where i is a non-zero natural number.

28. The display device of claim 27, wherein each of the shift registers further comprises:
a fifth transistor, a first source/drain thereof directly coupled to the common voltage, a gate thereof directly coupled to the second terminal of the second rectifying element, a second source/drain thereof directly coupled to a second output node; and
a sixth transistor, a first source/drain thereof directly coupled to the second output node, a gate thereof directly coupled to the second terminal of the first rectifying element, and a second source/drain thereof directly coupled to the third input node.

29. The display device of claim 28, wherein each of the shift registers further comprises:
an inverter, an input terminal thereof directly coupled to the second output node, and an output terminal thereof directly coupled to a third output node.

30. The display device of claim 29, wherein the inverter comprises:
a seventh transistor, a first source/drain thereof directly coupled to the common voltage, a gate thereof directly coupled to the second output node, a second source/drain thereof directly coupled to the third output node; and
a third rectifying element, a first terminal thereof directly coupled to the second input node, and a second terminal thereof directly coupled to the third output node.

31. The display device of claim 27, wherein each of the shift registers further comprises:
an inverter, an input terminal thereof directly coupled to the first output node, and an output terminal thereof directly coupled to a third output node.

32. The display device of claim 31, wherein the inverter comprises:
a seventh transistor, a first source/drain thereof directly coupled to the common voltage, a gate thereof directly coupled to the first output node, a second source/drain thereof directly coupled to the third output node; and
a third rectifying element, a first terminal thereof directly coupled to the second input node, and a second terminal thereof directly coupled to the third output node.

33. The display device of claim 27, wherein each of the shift registers further comprises:
an eighth transistor, a first source/drain thereof directly coupled to the common voltage, a gate thereof directly coupled to the first input node, a second source/drain thereof directly coupled to a fourth output node; and
a fourth rectifying element, a first terminal thereof directly coupled to the second input node, and a second terminal thereof directly coupled to the fourth output node.

34. The display device of claim 27, wherein the common voltage is a power source voltage, and the first to the fourth transistors are P-type transistors.

35. The display device of claim 34, wherein the first rectifying element is a P-type transistor, a gate and a first source/drain thereof directly coupled to the first terminal of the first rectifying element, and a second source/drain thereof directly coupled to the second terminal of the first rectifying element.

36. The display device of claim 34, wherein the second rectifying element is a P-type transistor, a gate and a first source/drain thereof directly coupled to the first terminal of the second rectifying element, and a second source/drain thereof directly coupled to the second terminal of the second rectifying element.

37. The display device of claim 27, wherein the common voltage is a ground voltage, and the first to the fourth transistors are N-type transistors.

38. The display device of claim 37, wherein the first rectifying element is a N-type transistor, a gate and a first source/drain thereof directly coupled to the first terminal of the first rectifying element, and a second source/drain thereof directly coupled to the second terminal of the first rectifying element.

39. The display device of claim 37, wherein the second rectifying element is a N-type transistor, a gate and a first source/drain thereof directly coupled to the first terminal of the second rectifying element, and a second source/drain thereof directly coupled to the second terminal of the second rectifying element.

* * * * *